(12) United States Patent
Fujiwara

(10) Patent No.: US 6,674,120 B2
(45) Date of Patent: Jan. 6, 2004

(54) NONVOLATILE SEMICONDUCTOR MEMORY DEVICE AND METHOD OF OPERATION THEREOF

(75) Inventor: Ichiro Fujiwara, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 09/842,795

(22) Filed: Apr. 27, 2001

(65) Prior Publication Data

US 2002/0000592 A1 Jan. 3, 2002

(30) Foreign Application Priority Data

May 2, 2000 (JP) ..................................... P2000-138251
Jun. 12, 2000 (JP) ..................................... P2000-180763

(51) Int. Cl.$^7$ ........................ H01L 29/76; H01L 29/792
(52) U.S. Cl. ........................................ 257/324; 257/316
(58) Field of Search ................................. 257/315–324; 438/257–265

(56) References Cited

U.S. PATENT DOCUMENTS 6,104,072 A * 8/2000 Hirota ........................ 257/405

* cited by examiner

*Primary Examiner*—Cuong Quang Nguyen
(74) *Attorney, Agent, or Firm*—Rader, Fishman & Grauer PLLC; Ronald P. Kananen

(57) ABSTRACT

A MONOS memory transistor capable of high speed write with a small current and superior in scaling, comprised of substrate (well W), a channel forming region, a first and a second impurity regions SBLi, SBLi+1 comprised of an opposite conductivity type semiconductor and sandwiching the channel forming region between them and acting as a source and a drain in operation, gate insulating films 10*a*, 10*b*, 14 and gate electrode WL on the channel forming region, and a charge storing means (carrier trap) which is formed in the gate insulating films 10*a* and 10*b* and dispersed in the plane facing the channel forming region and in the direction of thickness and is injected with hot holes caused by a band-to-band tunnel current from the impurity regions SLi or SLi+1 in operation.

34 Claims, 27 Drawing Sheets

CHANNEL FORMING REGION

READ OPERATION

ERASURE OPERATION

WRITE OPERATION

CHANNEL FORMING REGION

ERASURE OPERATION

CHANNEL FORMING REGION

CHANNEL FORMING REGION

ERASURE OPERTION (M11~M22)

NONVOLATILE SEMICONDUCTOR MEMORY DEVICE AND METHOD OF OPERATION THEREOF

BACKGROUND OF THE INVENTION

1. Field of the Invention

The present invention relates to a nonvolatile semiconductor memory device which has a planarly dispersed charge storing means (for example, in a MONOS type or an MNOS type, charge traps in a nitride film, charge traps near the interface between a top insulating film and the nitride film, small particle conductors, etc.) in a gate insulating film between a channel forming region and a gate electrode in a memory transistor and is operated to electrically inject a charge (electrons or holes) into the charge storing means to store the same therein and to extract the same therefrom and a method of operating (writing or erasing) the device.

2. Description of the Related Art

In an information society, or high-speed, broadband network society, there is a great demand for large capacity file memories for audio and video applications. Currently, in large capacity memory systems for storage of 1 GB (gigabytes) of data or more, use is made of disk memory systems employing disk storage media such as hard disks and optical disks. In recent years, studies have been actively performed trying to replace the disk media with nonvolatile semiconductor memories in this large market. Furthermore, mobile information terminals, which are capable of connecting to networks and expected to offer a large market in the future, are demanding removable storage media of small size and high reliability, and the nonvolatile semiconductor memory is the first candidate.

Although nonvolatile semiconductor memories suit the trend of small sized and light weighted hardware, presently, their storage capacities are still not sufficient, and semiconductor memories (flash memories) of capacities above 1 GB (gigabytes) and capable of erasure at one time have not been realized, yet. In addition to insufficient storage capacity, the reduction of cost per bit for the nonvolatile semiconductor memories is still not adequate compared with disk memories. In order to solve these problems, it is important to increase the integration degree of the nonvolatile semiconductor memories.

Along with the spread of broadband information networks, write speeds equivalent to the transmission rates of networks (for example, a carrier frequency of 100 MHZ) are being demanded even for nonvolatile semiconductor memories. This is because of the anticipation of development of information delivery employing a high-speed network in the near future. To realize high-speed downloads from networks, even nonvolatile semiconductor memories require write speed improvements of one or more orders of magnitude higher than the write speed of conventional FG-NAND type flash memories at 200 $\mu$s.

As nonvolatile semiconductor memories, in addition to the floating gate (FG) types wherein the charge storing means (floating gate) for holding the charge is planarly formed, there are known MONOS (metal-oxide-nitride-oxide semiconductor) types wherein the charge storing means are planarly dispersed.

In an MONOS type nonvolatile semiconductor memory, since the carrier traps in the nitride film [$Si_xN_y$ (0<x<1, 0<y<1)] or on the interface between the top oxide film and the nitride film, which are the main charge-retaining bodies, are spatially (that is, in the planar direction and thickness direction) dispersed, the charge retention characteristic depends on not only the thickness of a tunnel insulating film (bottom insulating film), but also on the energy and spatial distribution of the charges captured by the carrier traps in the $Si_xN_y$ film.

When a leakage current path is locally generated in the tunnel insulating film, in an FG type, a large amount of charge easily leaks out through the leakage path and the charge retention characteristic declines. On the other hand, in an MONOS type, since the charge storing means are spatially dispersed, only the charges near the leakage path will locally leak from it, therefore the charge retention characteristic of the entire memory device will not decline much. As a result, in a MONOS type, the disadvantage of the degradation of the charge retention characteristic due to the reduction in thickness of the tunnel insulating film is not so serious as in an FG type.

In addition, in order to realize a high-speed and high capacity nonvolatile semiconductor memory, scaling of its gate length is indispensable, and for this, scaling of the thickness of a tunnel insulating film is required. In an FG type, due to the degradation of the above charge retaining characteristics, scaling of the thickness of a tunnel insulating film is difficult, making a simple gate length scaling difficult. In contrast, in a MONOS type, the thickness of a tunnel insulating film can be made thin, and the gate length can be further miniaturized by that extent easily. That is, a MONOS type is superior to an FG type in scaling of the tunnel insulating film in a miniaturized memory transistor with an extremely small gate length.

To realize a miniaturized memory cell in a MONOS type nonvolatile semiconductor memory, it is important to improve the disturbance characteristic. Therefore, it is necessary to set the tunnel insulating film thicker than the normal thickness of 1.6 nm to 2.0 nm. When the tunnel insulating film is formed relatively thick, the write speed is in the range of 0.1 to 10 ms, which is still not sufficient.

In other words, in a conventional MONOS type nonvolatile semiconductor memory etc., to fully satisfy the requirements of reliability (for example, data retention, read disturbance, data rewrite, etc.), the write speed is limited to 100 $\mu$s.

A high speed is possible if the write speed alone is considered, but sufficiently high reliability and low voltage cannot be achieved. For example, a source-side injection type MONOS transistor has been reported wherein the channel hot electrons (CHE) are injected from the source side (IEEE Electron Device Letter, 19, 1998, p. 153). In this source-side injection type MONOS transistor, in addition to the high operation voltages of 12V for write operations and 14V for erasure operations, the read disturbance, data rewrite, and other facets of reliability are not sufficient.

On the other hand, taking note of the fact that it is possible to inject a charge into part of the dispersed charge traps area by the conventional CHE injection method, recently, it has been reported that by independently writing binary data into the source and drain side of a charge storing means, it is possible to record 2 bits of data in one memory cell. For example, Extended Abstract of the 1999 International Conference on Solid State Devices and Materials, Tokyo, 1999, pp. 522–523, considers that by changing the direction of the voltage applied between the source and drain to write 2 bits of data by injecting CHE and, when reading data, applying a specified voltage with a direction reversed to that for writing, i.e., the so-called "reverse read" method, correct reading of the 2 bits of data is possible even if the write time is short and the amount of the stored charge is small. Erasure is achieved by injecting holes by using a hand-to-hand tunnel current.

By using this technique, it becomes possible to increase the write speed and largely reduce the cost per bit.

However, in a CHE injection type MONOS type nonvolatile semiconductor memory of the related art, since electrons are accelerated in the channel to produce high energy electrons (hot electrons), it is necessary to apply a voltage larger than the 3.2 eV energy barrier of the oxide film, in practice a voltage of about 4.5V, between the source and drain. It is difficult to decrease this source-drain voltage. As a result, in a write operation, the punch-through effect becomes a restriction and good scaling of the gate length is difficult.

In addition, a write current of a few hundred $\mu A$ is needed, and as a result, there is another problem that it is impossible to write in parallel a large number of memory cells simultaneously.

Moreover, by a CHE injection method, because the write operation is performed with a current flowing in the channel of a memory transistor, it is impossible to simultaneously write at the source side and the drain side for the purpose of the aforesaid 2-bit data storage.

SUMMARY OF THE INVENTION

An object of the present invention is to provide a MONOS type or other nonvolatile semiconductor memory device, which basically operates by storing a charge in a planarly dispersed charge storing means such as a carrier trap, capable of write at a high speed with an extremely low current while suppressing the punch-through effect and wherein the scaling of the gate length and the thickness of the gate insulating film is good, and a method of operating (writing and erasing) the device.

According to a first aspect of the present invention, there is provided a nonvolatile semiconductor memory device comprising a substrate, a channel forming region comprised of a first conductivity type semiconductor and formed in the substrate, a first and a second impurity regions comprised of a second conductivity type semiconductor and formed in the substrate and sandwiching the channel forming region between them, acting as a source and a drain in operation, a gate insulating film provided on the channel forming region, a gate electrode provided on the gate insulating film, and a charge storing means which is formed in the gate insulating film and dispersed in the plane facing the channel forming region and in the direction of thickness and is injected with hot holes at the time of operation from the first or the second impurity regions.

Preferably, the hot holes are those caused by a band-to-band tunnel current.

In the present invention, the number of recorded bits per cell may be either 2 bits per cell or 1 bit per cell.

In the former case, the gate insulating film may comprise a first region into which hot holes are injected from the first impurity region, a second region into which hot holes are injected from the second impurity region, and a third region between the first and second regions and not injected by hot holes.

Further, the charge storing means may be formed in the first and second regions, and the region of distribution of the charge storing means is spatially separated by the third region. In the case of a MONOS type, the first and second regions are stacked film structures comprised of a number of films stacked together, and the third region is a single layer of a dielectric.

Furthermore, preferably, the gate electrodes formed on the first and second regions and the gate electrode formed on the third region are spatially separated from each other. Alternatively, the nonvolatile semiconductor memory device further comprises a first control gate at the outer side of the first region and a second control gate at the outer side of the second region which are spatially separated from the gate electrodes on the first, second and third regions.

When the gate electrodes formed on the first and second regions and the gate electrode formed on the third region are spatially separated from each other, two channel forming regions of two memory transistors and a channel forming region of a select transistor in between are in connection with each other in series.

In the case of storing one bit per cell, preferably, a memory transistor comprising the channel forming region, the first and second impurity regions, the gate insulating film and the gate electrodes has a gate length of no more than the gate length when the regions retaining hot holes from the first and second impurity regions are merged or partially merged in the gate insulating film when hot holes are injected from both the first and second impurity regions.

Further, in the present invention, preferably, a plurality of memory transistors each including the channel forming region, the first and second impurity regions, the gate insulating film and the gate electrodes are arranged in both a word direction and a bit direction. The nonvolatile semiconductor memory device further comprises a plurality of word lines for connecting the gate electrodes in the word direction, and word drive circuits connected to the plurality of word lines for applying a negative voltage to selected word lines to which memory transistors to be operated are connected, and a positive voltage to nonselected word lines to which memory transistors to be operated are not connected.

In each of the plurality of memory transistors, a threshold voltage in a write state is lower than that in an erasure state. In addition, the first conductivity type is a p-type, and the second conductivity type is an n-type.

In the present nonvolatile semiconductor memory device, a separated source line type, virtual grounding type, or other NOR type cell array structure wherein a common line connected to the first impurity region (for example, the drain impurity region) and a common line connected to the second impurity region (for example, the source impurity region) can be controlled independently is preferable.

In a separated source line type, the common line connected to the first impurity region is referred to as the first common line, while that connected to the second impurity region is referred to as the second common line.

In this case, the first and second common lines may have a hierarchical structure. In a so-called AND type cell array, memory transistors are connected in parallel to the first and the second sub-lines that are used as the inner interconnections in a memory block.

According to the second aspect of the present invention, there is provided a method of operating a nonvolatile semiconductor memory device comprising a substrate, a channel forming region comprised of a first conductivity type semiconductor and formed in the substrate, a first and a second impurity region comprised of a second conductivity type semiconductor and formed in the substrate and sandwiching the channel forming region between them, acting as a source and a drain in operation, a gate insulating film provided on the channel forming region, a gate electrode provided on the gate insulating film, and a charge storing means which is formed in the gate insulating film and dispersed in the plane facing the channel forming region and in the direction of thickness and is injected with hot holes at the time of operation from the first or the second impurity regions. The method comprises a step of injecting hot holes into the charge storing means from the first or second impurity region when writing data to the device.

Preferably, the hot holes are those caused by a band-to-band tunnel current.

The operation methods are different for storing two bits in one cell and storing one bit in one cell.

In the former case, preferably, in a write operation, the method of operating a nonvolatile semiconductor memory comprises steps of injecting hot holes into the first region of the gate insulating film from the first impurity region, and injecting hot holes from the second impurity region into the second region separated from the first region in the gate insulating film independently from the injection of hot holes to the first region.

In the latter case, in the method of operating a nonvolatile semiconductor memory device, the region retaining hot holes injected from the first impurity region is merged or partially merged in the gate insulating film with the region retaining hot holes injected from the second impurity region. Specifically, the gate length of a memory transistor including the channel forming region, the first and second impurity regions, the gate insulating film, and the gate electrodes is no more than the gate length when the two regions retaining hot holes are merged or partially merged in the gate insulating film.

In the present invention, even when the first and second regions in one cell are separated from those in other cells in the word direction (separated source line NOR type) or the first and second regions are shred by cells in the word direction (virtual grounding type), if the first gate electrode on the first region and the second gate electrode on the second region are separated, memory cells connected to the same word line can be written simultaneously within one operation cycle.

That is, in a write operation of a nonvolatile semiconductor memory device having a memory cell array comprised of a plurality of memory transistors each including the channel forming region, the first and second impurity regions, the gate insulating film and the gate electrodes and arranged in both a word direction and bit direction, wherein the gate electrodes are commonly connected through the word lines for every certain number of memory transistors in a word direction, the method for operation of the memory cell array comprises steps of applying a specified voltage to all of the first and second impurity regions corresponding to the first and second regions into which hot holes are injected for all memory transistors connected to the same word line, setting the first and second impurity regions corresponding to the first and second regions not injected with hot holes to an electrically floating state, applying a predetermined write voltage equal to a difference between voltages applied to the first and second impurity regions on the same word line, and writing all memory transistors connected to the same word line in parallel in one operation.

Further, in the present invention, the method of operating a nonvolatile semiconductor memory comprises a step of applying a predetermined write voltage between the first or second impurity regions and the gate electrodes when writing data to the device. For example, in a write operation of a nonvolatile semiconductor memory device having a memory cell array comprised of a plurality of memory transistors each including the channel forming region, the first and second impurity regions, the gate. insulating film and the gate electrodes and arranged in both a word direction and bit direction, wherein the gate electrodes are commonly connected through the word lines for every certain number of memory transistors in a word direction, the method comprises steps of applying a negative voltage to the selected word lines to which memory transistors to be operated are connected, and applying a positive voltage to the nonselected word lines to which memory transistors to be operated are not connected.

Preferably, the method of operating a nonvolatile semiconductor memory device comprises a step of applying the same voltage to the first and second impurity regions when writing data to the device. This method of applying voltages can be used in both operations of writing 2 bits per cell and 1 bit per cell, but it is especially preferable in the latter case because it increases the injection efficiency of hot holes. Note that when injecting hot holes from one side, the first or second impurity region on the side not injecting hot holes needs to be set open.

In addition, for a nonvolatile semiconductor memory device having a memory cell array comprised of a plurality of memory transistors each including said channel forming region, said first and second impurity regions, said gate insulating film and said gate electrodes and arranged in both a word direction and bit direction, wherein the first impurity regions are commonly connected through said first common lines and the second impurity regions are commonly connected through said second common lines for every certain number of memory transistors in a bit direction, the method in a writing operation for the memory cell array comprises steps of applying a positive voltage to the first and second common lines to which memory transistors to be operated are connected; and applying a voltage of 0V to the first and second common lines to which memory transistors to be operated are not connected.

The method of operating a nonvolatile semiconductor memory device comprises in an erasure operation a step of injecting electrons from the entire channel to the charge storing means into which hot holes are injected from said first or second impurity region by utilizing the direct tunnel effect or the FN tunnel effect.

The present nonvolatile semiconductor memory device and the method for operating the same are suitable for devices where the charge storing means is formed and dispersed in a plane facing the channel forming region and in the thickness direction such as the MONOS type, small particle type having so-called nanocrystals or other small particle conductors, etc.

In the method of operating a nonvolatile semiconductor memory device according to the present invention, when the conductivity type of the channel forming region of the memory transistor is n-type, a positive voltage of for example 5.0 to 6.0 V is applied to the first and second common lines (the first and second impurity regions) to which memory transistors to be operated are connected. Further, a negative voltage of for example −6.5 to −5.0V is applied to the selected word lines (gate electrodes) to which memory transistors to be operated are connected. On the other hand, a positive voltage of for example 0V to 5V is applied to the other nonselected word lines, and a voltage of 0V is applied to the other nonselected first, second common lines and substrate.

By optimizing the concentrations of the first and second impurity regions, surfaces of the first and second impurity regions are in deep depleted state, and the energy bands in this inversion layer bend sharply. Due to the band-to-band tunnel effect, electrons tunnel from the valence band and the conduction band, and flow to the first and second impurity region. As a result, holes occur, and part of them are accelerated by the electric field and become hot electrons. While the high energy charges (hot holes) generated in the first and second impurity regions maintain their moments (magnitude and direction), without little energy loss, they are injected into the charge storing means (carrier traps) quickly and at a high efficiency. Although the charge injection areas from the source and drain regions are both localized, if the gate length is for example less than 100 nm, in the plane of distribution of the charge storing means, the charge injection area of the first impurity region and the charge injection area of the second impurity region are at least partially merged near the center, so the charge is injected into substantially the entire area. Consequently, the threshold voltage of the memory transistor is largely decreased. Although the hole current itself is small (the substrate current is 2 nA per cell), as described here, because the charge is injected into substantially the entire region of the plane of distribution of the charge storing means, the write time for obtaining a necessary change of the threshold voltage is, for example, less than 20 µs or shortened by more than one order of magnitude when compared with a conventional memory cell that is able to be written in parallel.

On the other hand, as the most suitable memory transistor structure for writing 2 bits in one cell, for example, the gate insulating film including the charge storing means (carrier traps) is split in the channel direction into first and second regions located at the two sides of the gate insulating film and the third region between them is made of an insulating film of a single material not containing a charge storing means. The third region at the center functions as a MOS type control transistor.

In this structure, by controlling the threshold voltage of the MOS transistor within a certain range, reading can be performed with a constant current. In other words, when there is no MOS transistor, if the hot holes are over-injected and the threshold voltage of the memory transistor is largely decreased, the read current will fluctuate and much current will be wasted. However, in the present invention, because of the presence of the MOS transistor, if the threshold voltage of the memory transistor largely decreases and the read current starts to increase, the MOS transistor cuts off and functions as a limiter. As a result, in such a memory cell, the upper limit of the read current can be controlled by the threshold voltage of the MOS transistor and there is no unnecessary current consumption.

In addition, when erasing data, for example, under the condition that the first or the second impurity region and the substrate are set to 0V, a positive voltage is applied to the word lines, and electrons are injected into the charge storing means from the entire channel by using the direct tunnel effect or the FN tunnel effect. As a result, the threshold voltage rises leading to an erasure state. By this erasure method, it is possible to erase a block simultaneously.

BRIEF DESCRIPTION OF THE DRAWINGS

These and other objects and features of the present invention will become clearer from the following description of the preferred embodiments given with reference to the accompanying drawings, in which:

FIG. 24A is a circuit diagram of the write bias conditions of a memory transistor according to the sixth embodiment of the present invention, while

FIG. 26A is a circuit diagram of the erasure bias conditions of a memory transistor according to the sixth embodiment of the present invention, while

DESCRIPTION OF THE PREFERRED EMBODIMENTS

Below, preferred embodiments will be described with reference to the accompanying drawings.

First Embodiment

Figure 1:
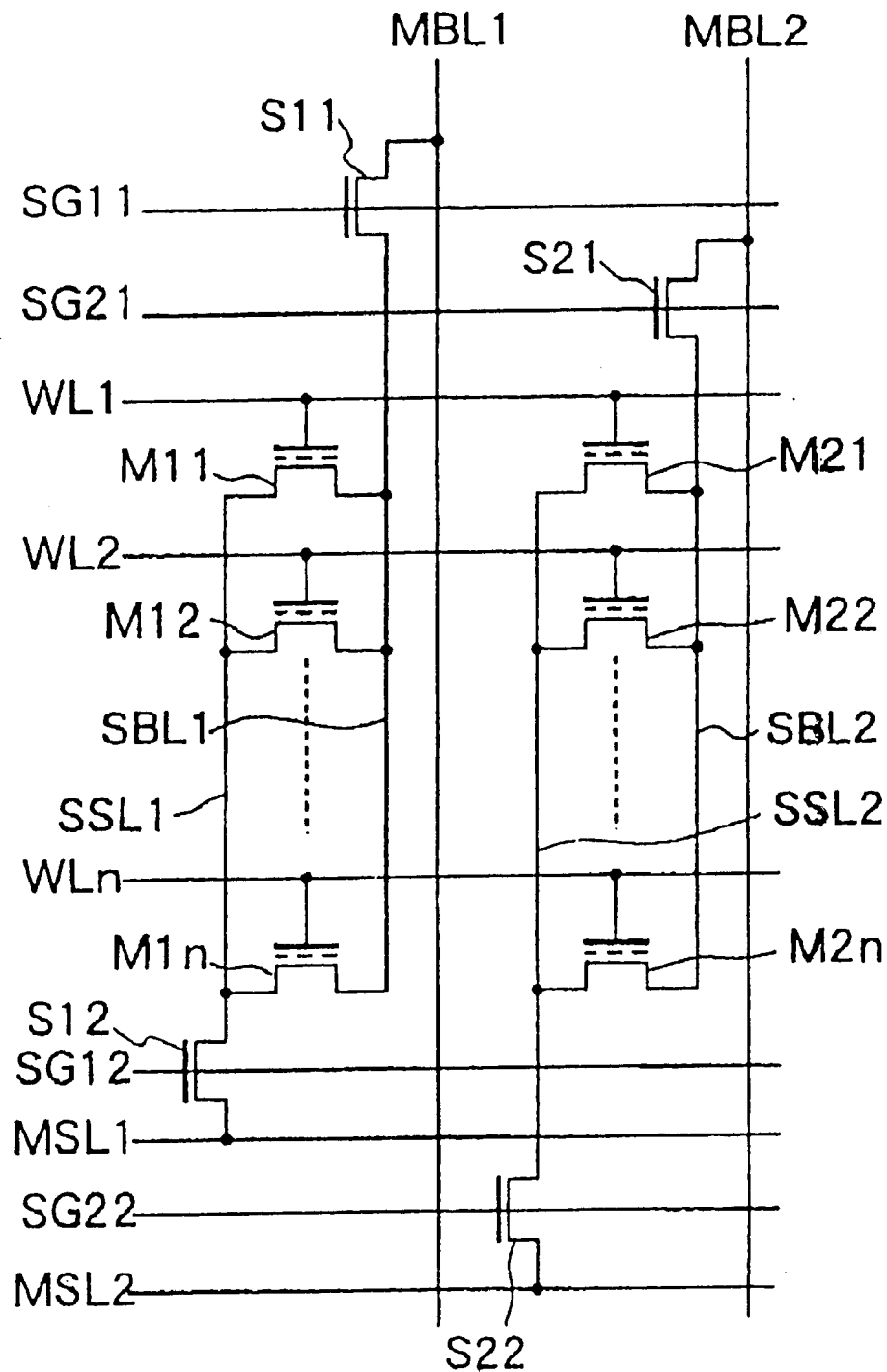
FIG. 1 is a circuit diagram of the configuration of a memory cell array of a nonvolatile semiconductor memory device according to a first embodiment of the present invention.
Figure 2:
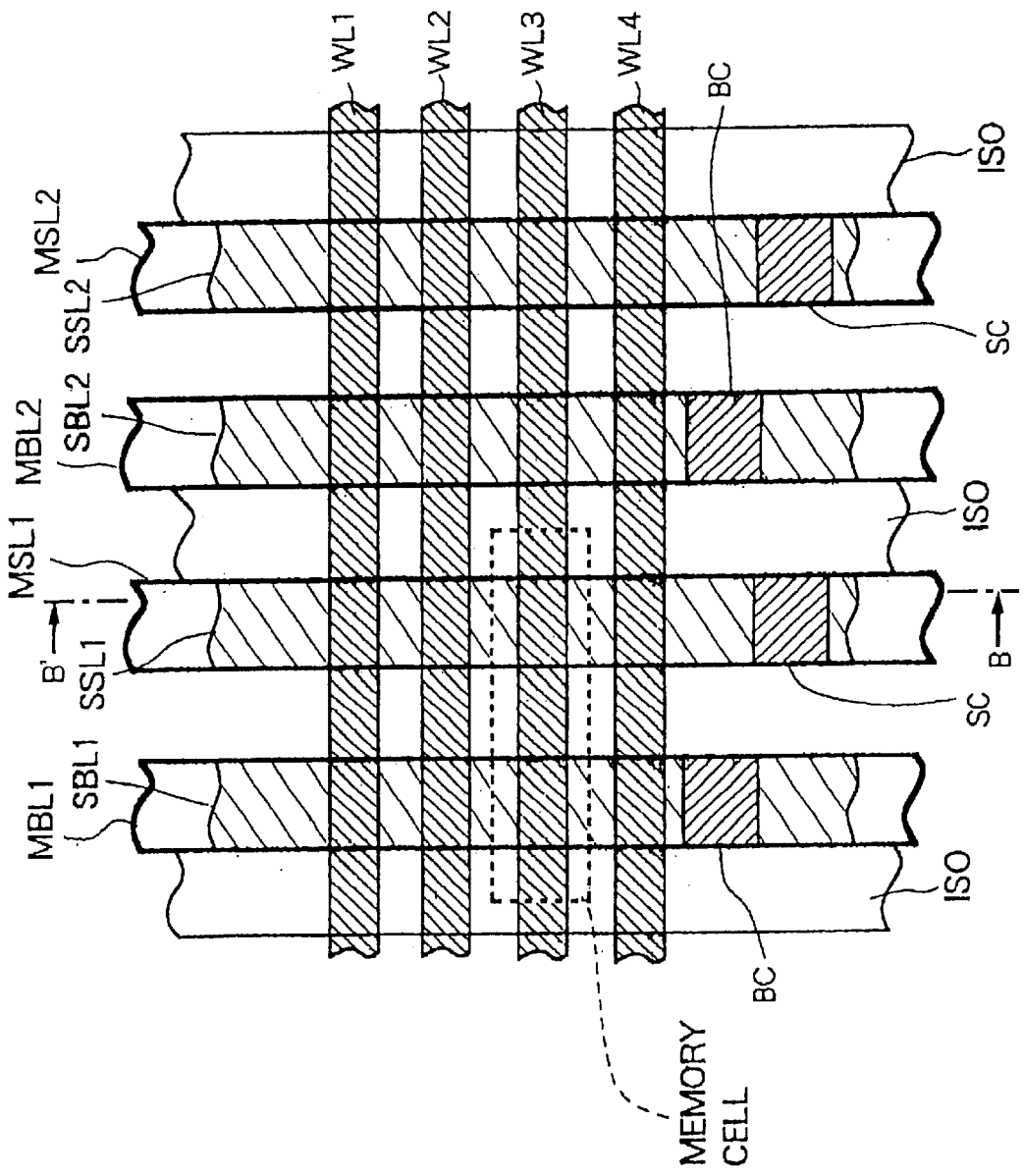
FIG. 2 is a plan view of an NOR type memory cell array according to the first embodiment of the present invention.
Figure 3:
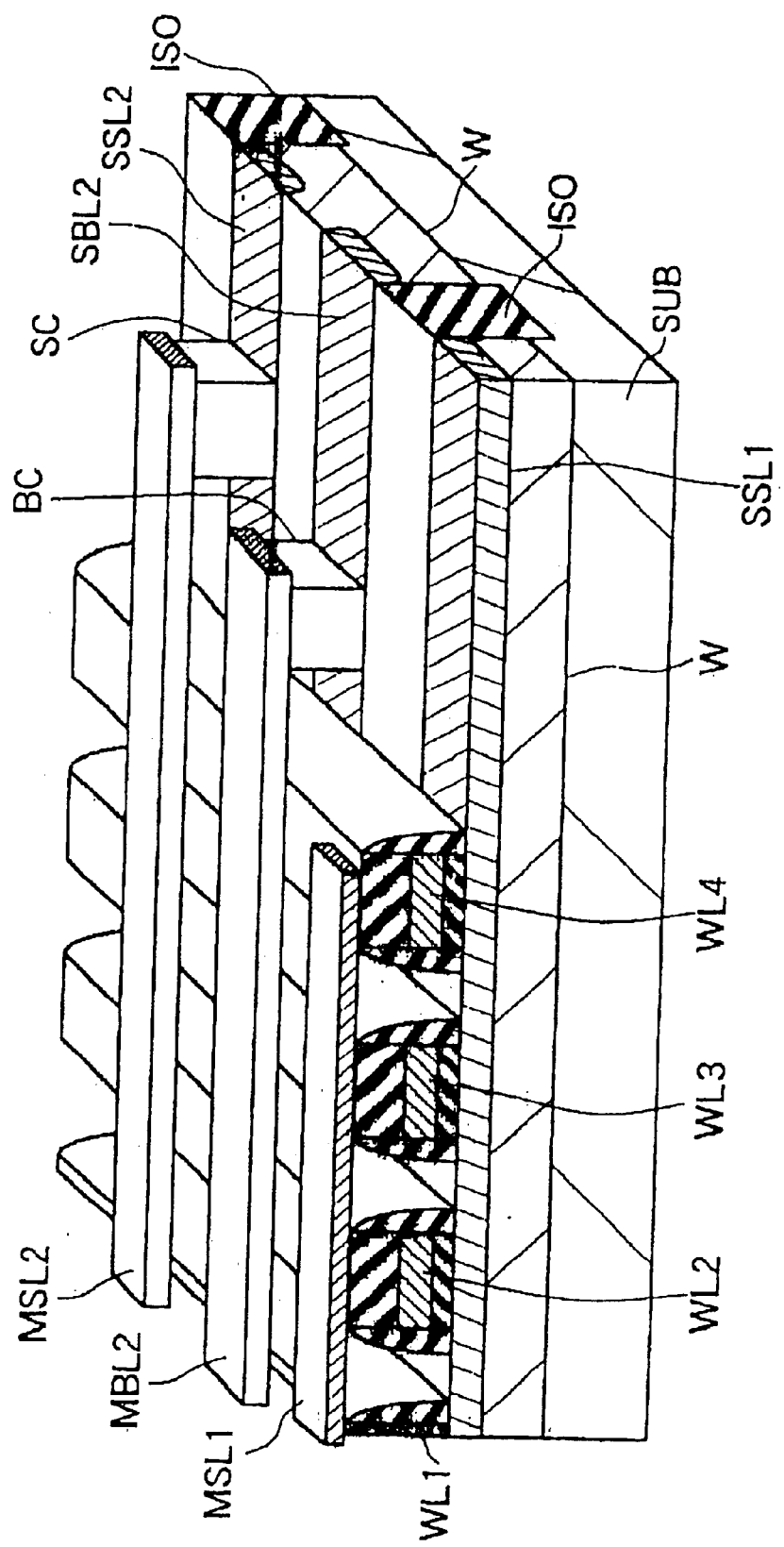
FIG. 3 is a cross-sectional bird's-eye view of the NOR type memory cell array according to the first embodiment of the present invention along the line BB' shown in FIG. 2.

FIG. 1 is a circuit diagram of the memory cell array of a nonvolatile semiconductor memory device according to the first embodiment of the present invention, FIG. 2 is the plan view of an NOR type memory cell array, and FIG. 3 is a cross-sectional bird's-eye view along the line BB' in FIG. 2.

In the present nonvolatile semiconductor memory device, bit lines (first common lines) are hierarchized into main bit lines and sub-bit lines, while source lines (second common lines) are hierarchized into main source lines and sub-source lines.

A sub-bit line SBL1 is connected to a main bit line MBL1 through a select transistor S11, and a sub-bit line SBL2 to a main bit line MBL2 through a select transistor S21. Further, a sub-source line SSL1 is connected to a main source line MSL1 through a select transistor S12, and a sub-source line SSL2 to a main source line MSL2 through a select transistor S22.

Memory transistors M11 to M1n (for example, n=128) are connected in parallel to the sub-bit line SBL1 and the sub-source line SSL1, and memory transistors M21 to M2n are connected in parallel to the sub-bit line SBL2 and the sub-source line SSL2. The n number of memory transistors connected in parallel to each other and the two select transistors (S11 and S12, or S21 and S22) compose a unit block of the memory cell array.

The gate electrodes of the memory transistors M11, M21 . . . adjacent in the word line direction are connected to the word line WL1. Similarly the gate electrodes of the memory transistors M12, M22 . . . are connected to the word line WL2. Further, the gate electrodes of the memory transistors M1n, M2n . . . are connected to the word line WLn.

The select transistors S11, . . . adjacent in the word line direction are controlled by a select line SG11. while select transistors S21, . . . are controlled by a select line SG21. Similarly, select transistors S12, . . . adjacent in the word line direction are controlled by a select line SG12, while select transistors S22, are controlled by a select line SG22.

In this miniature NOR type cell array, as shown in FIG. 3, p-wells W are formed in the vicinity of the surface of the semiconductor substrate SUB. The p-wells W are separated in the word line direction by element isolation layers ISO which are formed by burying an insulator into trenches and are arranged in parallel stripes.

The p-well W region separated by the element isolation layers ISO becomes the active region of a memory transistor. An n-type impurity is doped at a high concentration into parallel stripes at a distance from each other at the two sides of the active region in the width direction, thereby forming sub-bit lines SBL1, SBL2 (hereinafter indicated by SBL) and sub-source lines SSL1, SSL2 (hereinafter indicated by SSL).

Above and perpendicular to the sub-bit lines SBL and the sub-source lines SSL via insulating films, word lines WL1, WL2, WL3, WL4, . . . (hereinafter indicated by WL) are arranged at regular intervals. These word lines WL are above the p-well W and the element isolation films ISO via the insulating films containing the charge storing means inside.

The intersecting portion of a portion of a p-well W between a sub-bit line SBL and a sub-source line SSL with a word line WL forms the channel forming region of a memory transistor. The region of the sub-bit line and the region of the sub-source line adjacent to the channel forming region function as the drain and source, respectively.

The word lines WL are covered by offset insulating layers on their upper surfaces and sidewall insulating layers on their sidewalls (in the present case, a normal interlayer insulating film is also possible).

In these insulating layers, bit contacts BC contacting the sub-bit lines SBL and source contacts SC contacting the sub-source lines SSL are formed at certain intervals. For example, one bit contact BC and one source contact SC are set for every 128 memory transistors in the bit line direction.

Above the insulating layers, main bit lines MBL1, MBL2, . . . in contact with the bit contacts BC and main source lines MSL1, MSL2, . . . , in contact with the source contacts SC are formed alternately in parallel stripes.

In this miniature NOR type cell array, the first common lines (bit lines) and the second common lines (source lines) are hierarchical in structure, hence it is not necessary to set a bit contact BC and a source contact SC for each memory cell. Accordingly, in principle, there is no variation in the contact resistance itself. A bit contact BC and a source contact SC are formed for example for every 128 memory cells. If plugs are not formed by self alignment, the offset insulating layers and the sidewall insulating layers are not needed. That is, an ordinary interlayer insulating film is deposited thickly to bury the memory transistors, then contacts are opened by the conventional photolithography and etching.

Since a quasi contactless structure is formed wherein the sub-lines (sub-bit lines and sub-source lines) are formed by the impurity regions, there is almost no wasted space, so when forming layers by the minimum line width F of the limit of the wafer process, very small cells of areas close to $8F^2$ can be fabricated.

Moreover, because the bit lines and source lines are hierarchized and select transistors S11 or S21 separate the parallel memory transistor groups in nonselected unit blocks from the main bit lines MBL1 or MBL2, the capacitances of the main bit lines are appreciably reduced and the speed increased and power consumption decreased. In addition, due to the functions of the select transistors S12 and s22, the sub-source lines are separated from the main source lines enabling a reduction in capacitances.

To further increase speed, the sub-bit lines SBL and sub-source lines SSL may be formed by impurity regions clad with a silicide and the main bit lines MBL and main source lines MSL may be made metal interconnections.

Figure 4:
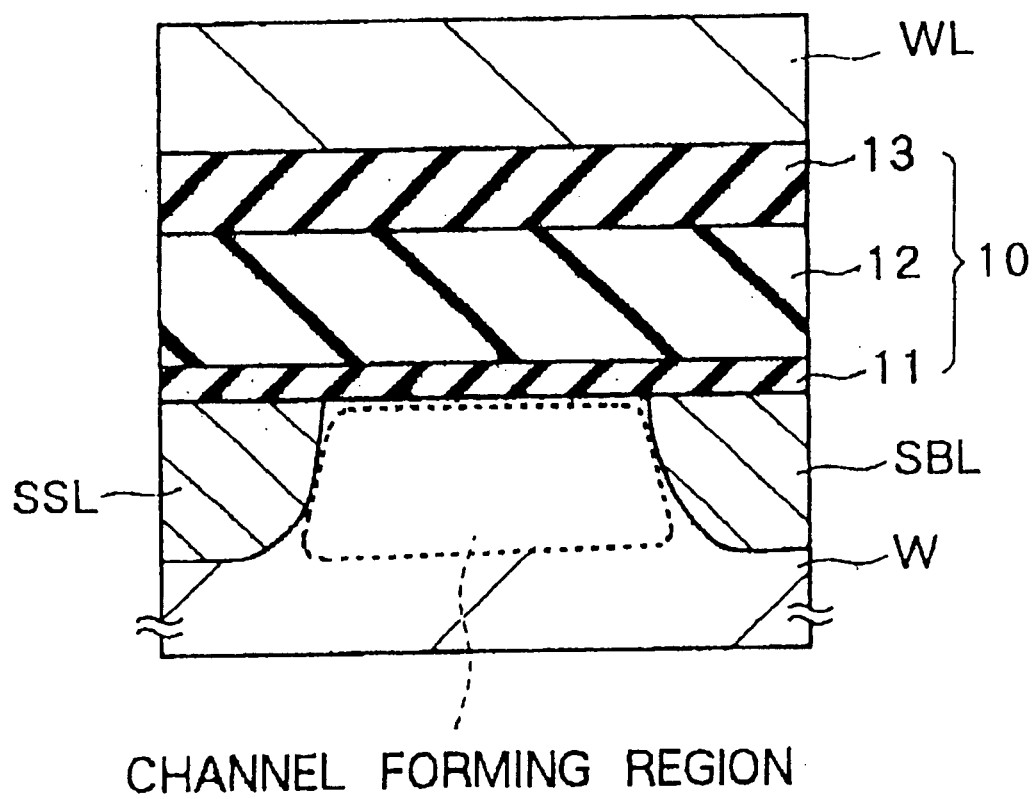
FIG. 4 is an enlarged cross-sectional view of a memory transistor according to the first embodiment of the present invention in the word line direction.

FIG. 4 is an enlarged cross-sectional view of a memory transistor in the word line direction.

In FIG. 4, the region between the sub-bit line SBL and the sub-source line SSL crossing with a word line is the channel forming region of that memory transistor.

On the channel forming region, a gate electrode (word line WL) is stacked via a gate insulating film 10. Usually the word line WL is comprised of polysilicon that is made conductive by doping a p-type or n-type impurity at a high concentration (doped poly-Si) or of a stacked film of doped poly-Si and a refractory metal silicide. The effective part of the word line (WL), that is, the length equivalent to the source-drain distance in the channel direction (gate length) is below 0.1 $\mu$m, for example, 80 nm to 90 nm.

In the present embodiment, the gate insulating film consists of a bottom insulating film 11, a nitride film 12, and a top insulating film 13 in order from the bottom.

The bottom film 11, for example, is formed by forming an oxide film, then transforming this to a nitride film. The thickness of the bottom film 11 can be selected in the range from 2.5 nm to 6.0 nm corresponding to the application. Here, it is set in the range of 2.7 nm to 3.5 nm here.

The nitride film 12 is comprised of, for example, a silicon nitride film [$Si_xN_y$ (0<x<1, 0<y<1)] that is 6.0 nm in thickness. The nitride film 12 is fabricated by low pressure chemical vapor deposition (LP-CVD) and includes a large number of carrier traps. The nitride film 12 exhibits a Frenkel-Pool type (FP type) electroconductivity.

The top insulating film 13 is formed by thermally oxidizing a formed nitride film since it is necessary to form deep carrier traps at a high density near the interface with the nitride film 12. Alternatively, an $SiO_2$ film formed by high temperature chemical vapor deposited oxide (HTO) may also be used as the top insulating film 13. When the top insulating film 13 is formed by CVD, the traps are formed by heat treatment. The thickness of the top insulating film 13 must be greater than 3.0 nm, preferably over 3.5 nm, in order to effectively block the injection of holes from the gate electrode (word line WL) and prevent a reduction of the number of data write-erasure cycles.

In the fabrication of memory transistors of this structure, first, the element isolation layers ISO and p-wells W are formed in the surface of a prepared semiconductor substrate SUB, then the impurity regions forming the sub-bit lines and the sub-source lines are formed by ion implantation. If necessary, ion implantation is performed for adjustment of the threshold voltage.

Next, the gate insulating film 10 is formed on the surface of the semiconductor substrate SUB.

In more detail, the silicon oxide film (bottom insulating film 11) is formed by heat treatment for example at 1000° C. for 10 seconds by rapid high temperature oxidation (RTO).

Next, a silicon nitride film (nitride insulating film 12) is deposited on the bottom insulating film 11 by LP-CVD to a thickness slightly greater than the final thickness of 6 nm. This LP-CVD is performed using as a feedstock gas, for example, a mixture comprised of dichlorosilane (DCS) and ammonia at a substrate temperature of 730° C.

The surface of the formed silicon nitride film is then oxidized by thermal oxidization to form a silicon oxide film of, for example, 3.5 nm (top insulating film 13). This thermal oxidation is performed, for example, in an $H_2O$ atmosphere at a furnace temperature of 950° C. for 40 minutes. In this way, deep carrier traps with a trap level (energy difference from conduction band of silicon nitride film) less than 2.0 eV or so are formed at a density of about 1 to $2\times10^{13}/cm^2$. The heat oxidized silicon film (top insulating film 13) is formed to a thickness of 1.5 nm with respect to a nitride film 12 of 1 nm. The thickness of the underlying nitride film is reduced according to this proportion, so the final thickness of the nitride film 12 becomes 6 nm.

A conductive film forming the gate electrodes (word lines WL) and the offset insulating layer (not shown) are stacked, then this stacked layer is processed to the same pattern.

Next, to fabricate a memory cell array structure as shown in FIG. 3, the self alignment contacts are formed along with the sidewall insulating films. Bit contacts BC and source contacts SC are formed on the sub-bit lines SBL and the sub-source lines SSL exposed through the self alignment contacts.

Then, the regions surrounding these plugs are buried with the interlayer insulating film. The main bit lines and the main source lines are formed on the interlayer insulating film, then the upper layer interconnections are formed over the interlayer insulating film, the overcoat film is formed, and pads are opened, thereby completing the nonvolatile memory cell array.

Next, an example of setting the bias and the operation of a nonvolatile memory of such a configuration will be explained using as an example the operation of writing data to a memory transistor M11.

Figure 5:
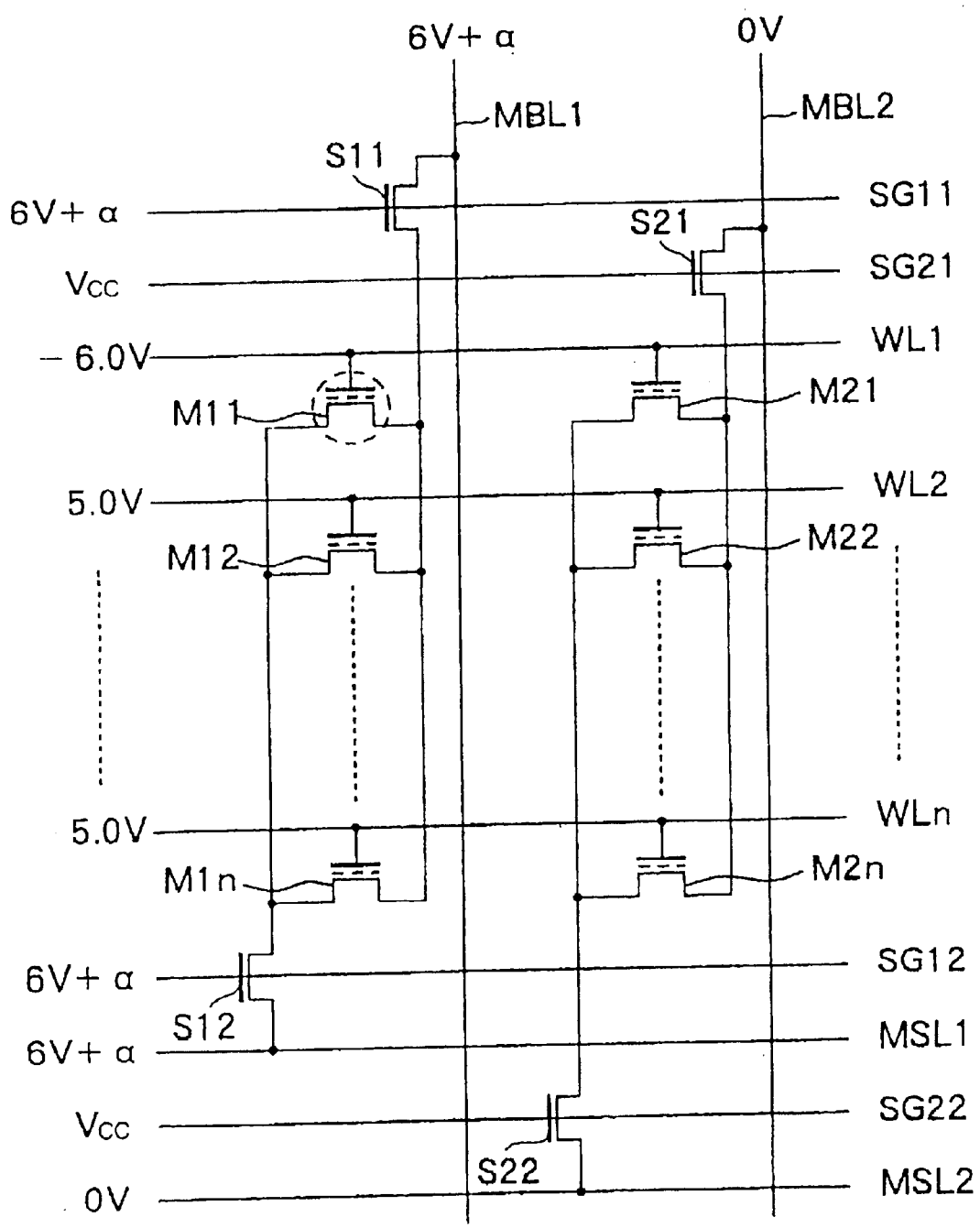
FIG. 5 is a circuit diagram showing the bias conditions of a write operation in a memory transistor according to the first embodiment of the present invention.
Figure 6:
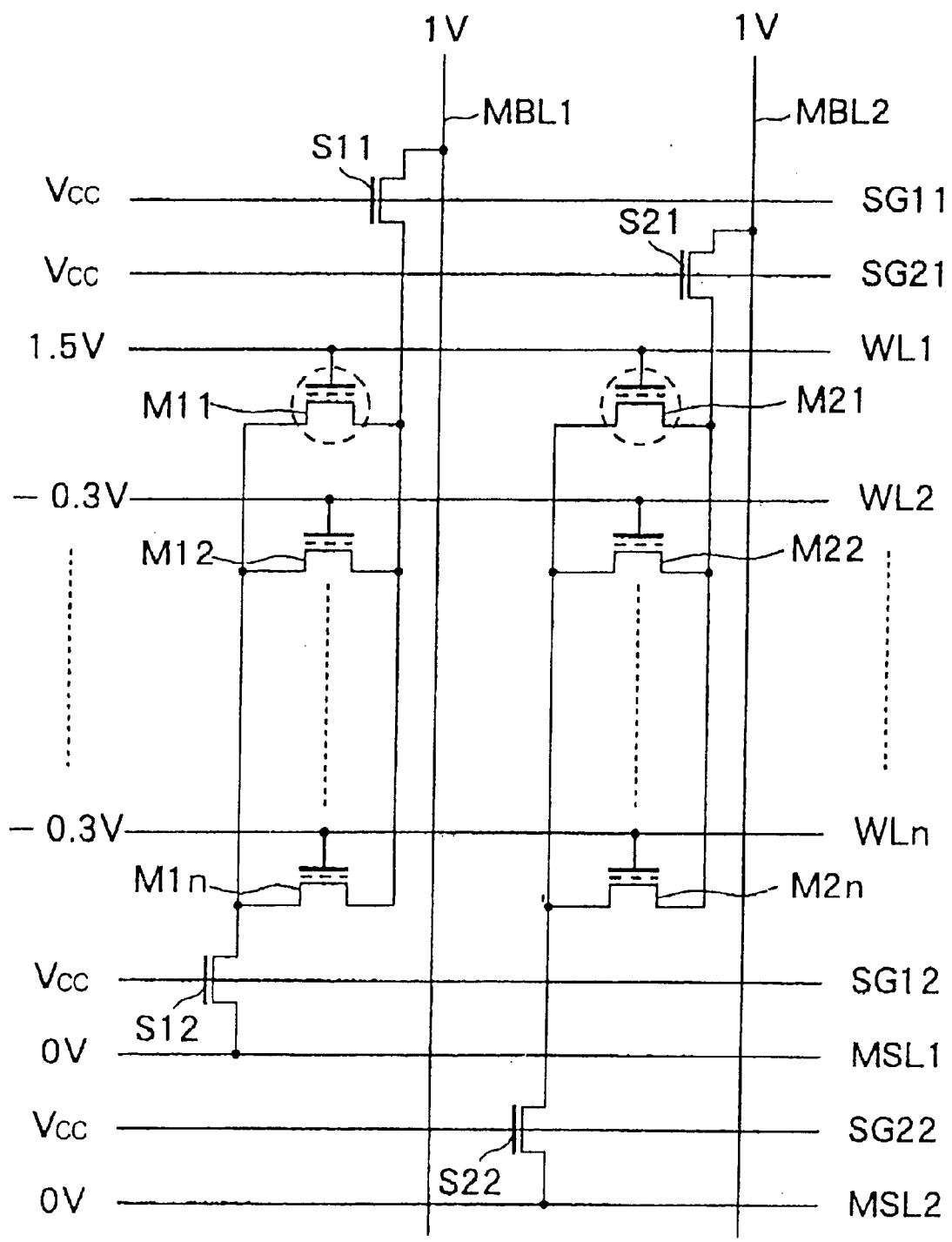
FIG. 6 is a circuit diagram showing the bias conditions of a read operation in a memory transistor according to the first embodiment of the present invention.
Figure 7:
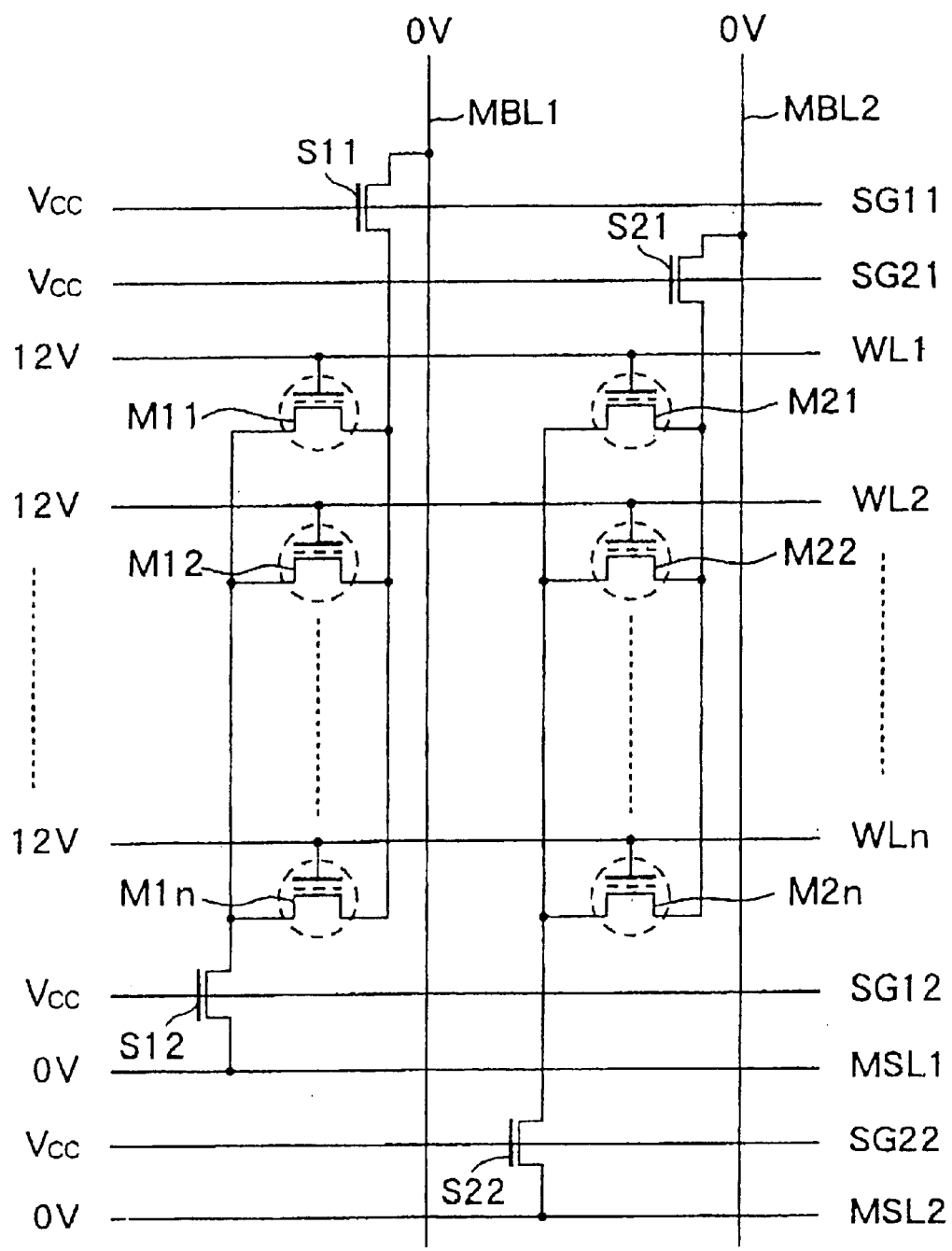
FIG. 7 is a circuit diagram showing the bias conditions of an erasure operation in a memory transistor according to the first embodiment of the present invention.
Figure 8:
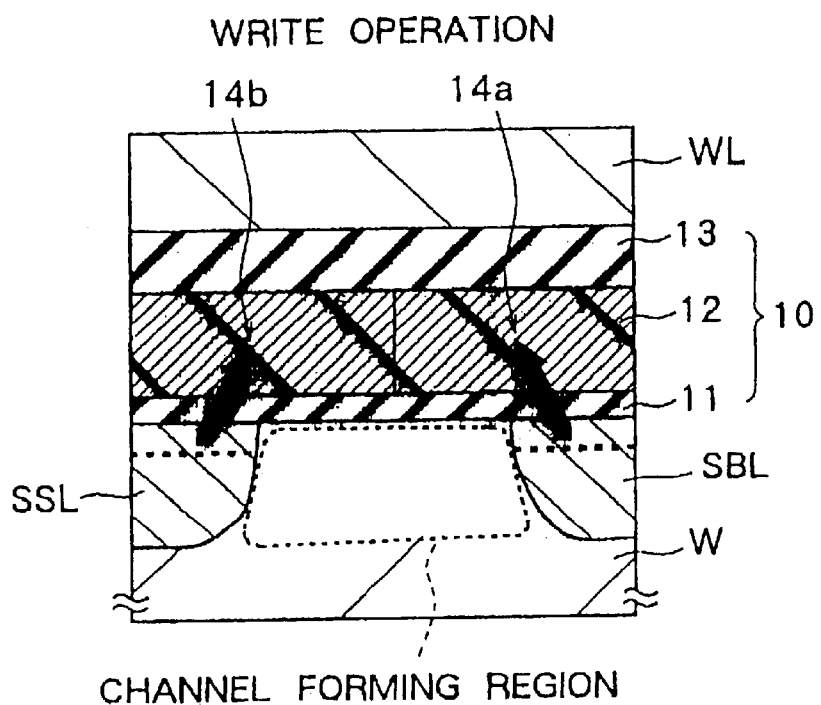
FIG. 8 is an enlarged cross-sectional view in the word line direction illustrating the write operation of a memory transistor according to the first embodiment of the present invention.
Figure 9:
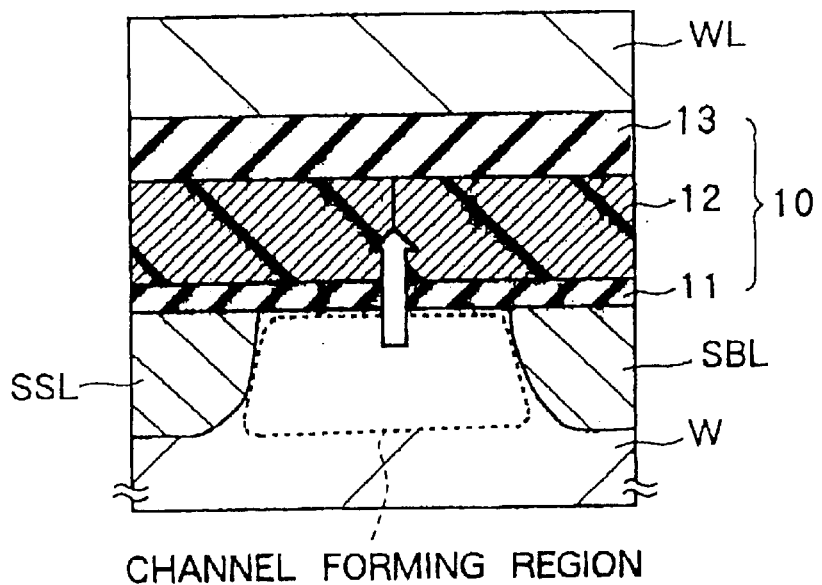
FIG. 9 is an enlarged cross-sectional view in the word line direction illustrating the erasure operation of a memory transistor according to the first embodiment of the present invention.

FIG. 5 is a circuit diagram showing the bias conditions of a write operation, FIG. 6 is a circuit diagram showing the bias conditions of a read operation, and FIG. 7 is a circuit diagram showing the bias conditions of an erasure operation. FIG. 8 is a cross-sectional view of a transistor for illustrating a write operation, while FIG. 9 is a cross-sectional view of a transistor for illustrating an erasure operation.

In a write operation, as shown in FIG. 5, a specified negative voltage of, for example, −6.0V, is applied to the selected word line WL1, and a positive voltage of, for example, 6.0V+α(α represents the threshold voltages of transistors S11 and S12), is applied to the selected main bit line MBL1, the selected main source line MSL1, and the select lines SG11, SG12. A write inhibit voltage of, for example, 5V, is applied to the nonselected word lines WL2 to WLn, while 0V is applied to the nonselected main bit line MBL2, the nonselected main source MSL2, and the substrate (p-well W). At the same time, the select lines SG21 and SG22 are maintained at the power voltage Vcc.

Therefore, a voltage of 6V is transmitted to the selected sub-bit line SBL1 and the selected sub-source line SSL1, and a voltage of 0V is transmitted to the nonselected sub-bit line SBL2 and the nonselected sub-source line SSL2.

Under these write conditions, in the memory transistor M11 to which data is to be written, due to the application of a negative bias to the selected word line WL1, the surface of the n-type impurity region forming the sub-bit line SBL1 and sub-source line SSL1 is deeply depleted and the energy bands bend sharply. As a result, because of the band-to-band tunnel effect, electrons in the valence band tunnel to the conduction band and flow into the n-type impurity region, and holes are generated. Those holes drift more or less to the center of the channel forming region and are accelerated by the electric field there, whereby part become hot holes. The moments (magnitude and direction) of the high energy charges (hot holes) generated in the n-type impurity region are maintained and their kinetic energies are not lost much at all, therefore the holes are injected into the carrier traps formed as the charge storing means at a high speed and with a high efficiency.

The charge injection from the n-type impurity region forming the sub-bit line SBL1 and the charge injection from the n-type impurity region forming the sub-source line SSL1 are both localized. However, because the gate length is no more than 100 nm in the memory transistor according to the present invention, as shown in FIG. 8, in the distribution plane of the charge storing means, the area of charge injection from the SBL side 14a merges with the area of charge injection from the SSL side 14b at the center, hence, the hole injection occurs above substantially the entire area of the channel forming region. As a result, the threshold voltage of memory transistor M11 is largely deceased, and the write operation is performed. In other words, in the present embodiment, the shorter the gate length, the more efficiently holes are injected into the entire area of the distribution plane of the charge storing means facing the channel forming region.

On the other hand, in the nonselected memory transistors in the same block M12, . . . , only 1V is applied between the gate and the source or the drain. Further, in the nonselected memory transistors in other blocks, such as M21, M22 . . . , only 5V or 6V is applied between the gate and the source or the drain. Therefore, holes are not injected into the charge storing means, and write operation is effectively inhibited.

In such a write process, because the charge acceleration direction is substantially the same as the injection direction, the injection efficiency is higher than the conventional CHE injection method. In addition, because a channel is not formed during a write operation, the current consumption is low. Although the hole current is small, because a charge is injected into substantially the entire area of the distribution plane of the charge storing means, the write time for obtaining a necessary change of the threshold voltage is, for example, less than 20 μs or reduced by more than one order of magnitude compared with the related art.

Figure 10:
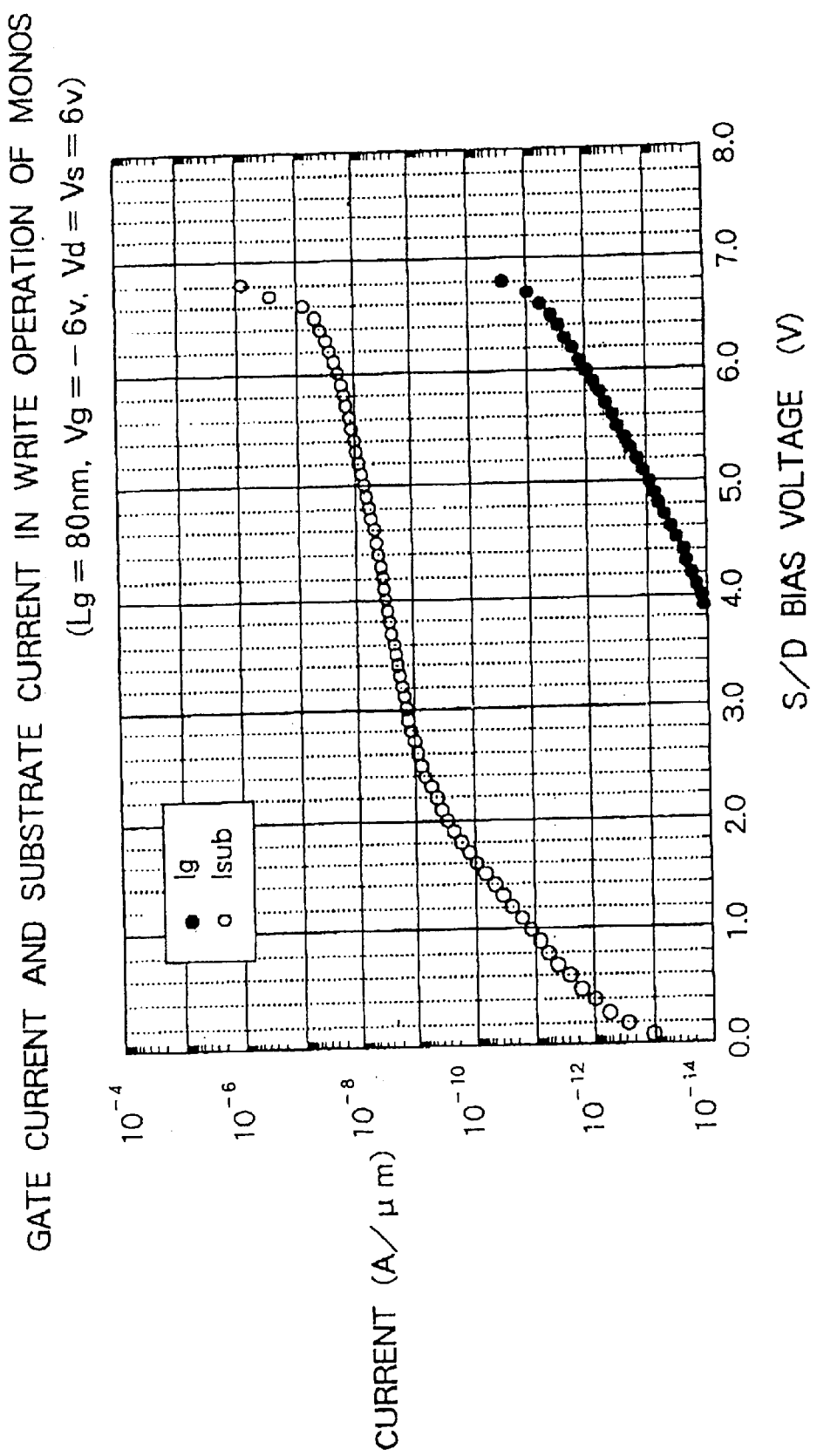
FIG. 10 is a graph showing the dependence of a substrate current on the S/D bias of a gate current in a memory transistor according to the first embodiment of the present invention.

FIG. 10 presents the dependence of the substrate current on the source/drain (S/D) bias for the gate current when the gate voltage Vg=−6V.

The current under the write conditions (Vg=−6V, Vs=Vd= 6V) is about 20 nA/μm, so if the gate width is 10 μm, a write current per bit as small as 200 nA per cell can be realized.

In the above write operation, blocks containing the selected cells that should be written and blocks containing the nonselected cells that should be inhibited are set using the bias conditions.

In the present embodiment, it is possible to select all blocks to write all the cells connected to the word line WL1 simultaneously (page write operation). Due to the aforesaid improvement of the injection efficiency, the write current per bit is decreased by more than one order of magnitude, so the number of cells able to be written in parallel at one time is increased to about one kB in the present embodiment compared with only one byte of cells with the conventional CHE injection method.

When reading data, the read operation is basically a page read.

As shown in FIG. 6, a preset drain voltage of for example 1.0V is applied to the main bit lines MBL1, MBL2, . . . . Further a specified read inhibit voltage, for example, −0.3V, is applied to the nonselected word lines WL2, WL3, . . . . 0V is also applied to the main source lines MSL1 and MSL2 and the substrate (p-well W). In addition, all the select lines SG11, SG21, SG12, SG22 are maintained at the power voltage Vcc. Under these conditions, a specified gate voltage of, for example, 1.5V to 2.0V, is applied to word line WL1 to be read.

In this way, memory transistors M11, M21 . . . that are connected to word line WL1 are turned on or turned off in accordance with the write conditions, and the voltage on the main bit line changes only when the memory transistor is turned on. This change in voltage is amplified and read out by a not shown sense amplifier etc.

Erasure is performed by injecting electrons from the entire channel using the modified FN (MFN) tunneling effect or the direct tunneling effect.

When erasing an entire block at one time by the MFN tunneling, as shown in FIG. 7, 12V is applied to all word lines WL1, WL2, . . . , and 0V is applied to all main bit lines MBL1, MBL2, all main source lines MSL1, MSL2, and the substrate (p-well W). At the same time, all select lines SG11, SG21, SG12, SG22 are kept at the power voltage Vcc.

In this way, as shown in FIG. 9, electrons are injected to carrier traps formed as the charge storing means from the substrate side, the threshold voltage rises, and erasure is performed. The time for erasure by injecting electrons can be reduced to about 0.4 ms or improved by more than two orders of magnitude compared with the typical erasure time of 100 ms of the conventional hole injection erasure using the direct tunnel effect. Further, in the conventional erasure method by hole injection, the time for the charge to pass through the bottom insulating film is longer than with a write operation, so the insulating film may deteriorate. In the present invention, since hot hole injection is employed in write operation that has a short charge passing time, and erasure is performed by injecting electrons, the reliability is high.

Figure 11:
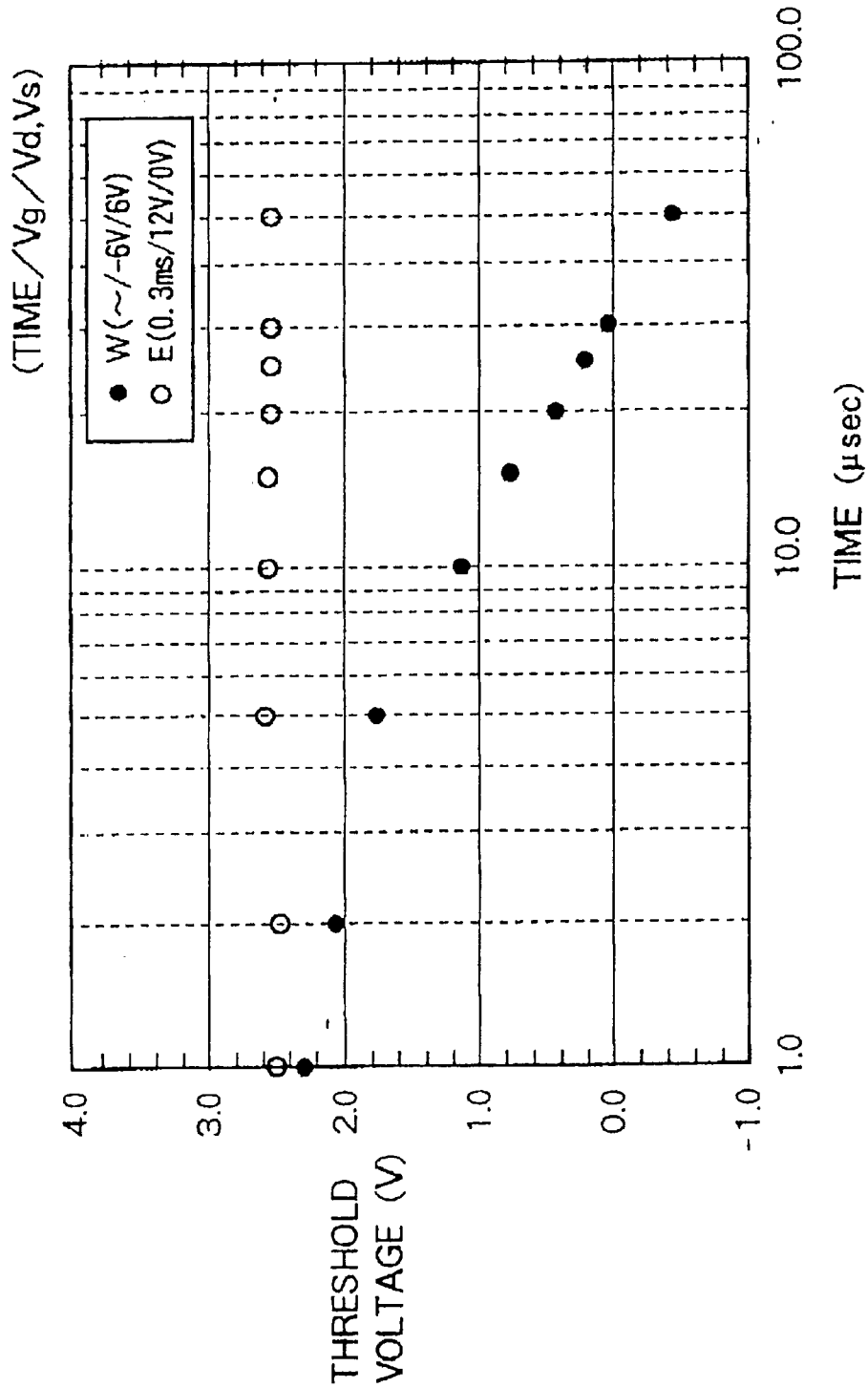
FIG. 11 is a graph showing the write characteristics of a 2.9 nm bottom insulating film in a memory transistor according to the first embodiment of the present invention.

FIG. 11 shows the write characteristics of a memory transistor having a bottom insulating film that is 2.9 nm in film thickness and 90 nm in gate length. The write condition is as follows: the gate voltage Vg is −6V, the source voltage Vs and drain voltage Vd are 6V, and the well voltage is 0V. It was found that the threshold voltage decreased along with the increase of write time, and a sufficient reduction in the threshold voltage could be obtained at 20 μs. This indicates that writing data at 20 μs is possible. The erasure condition includes that the gate voltage Vg is 12V, the source voltage Vs and drain voltage Vd are 0V, and the erasure time is 0.3 ms.

Figure 12:
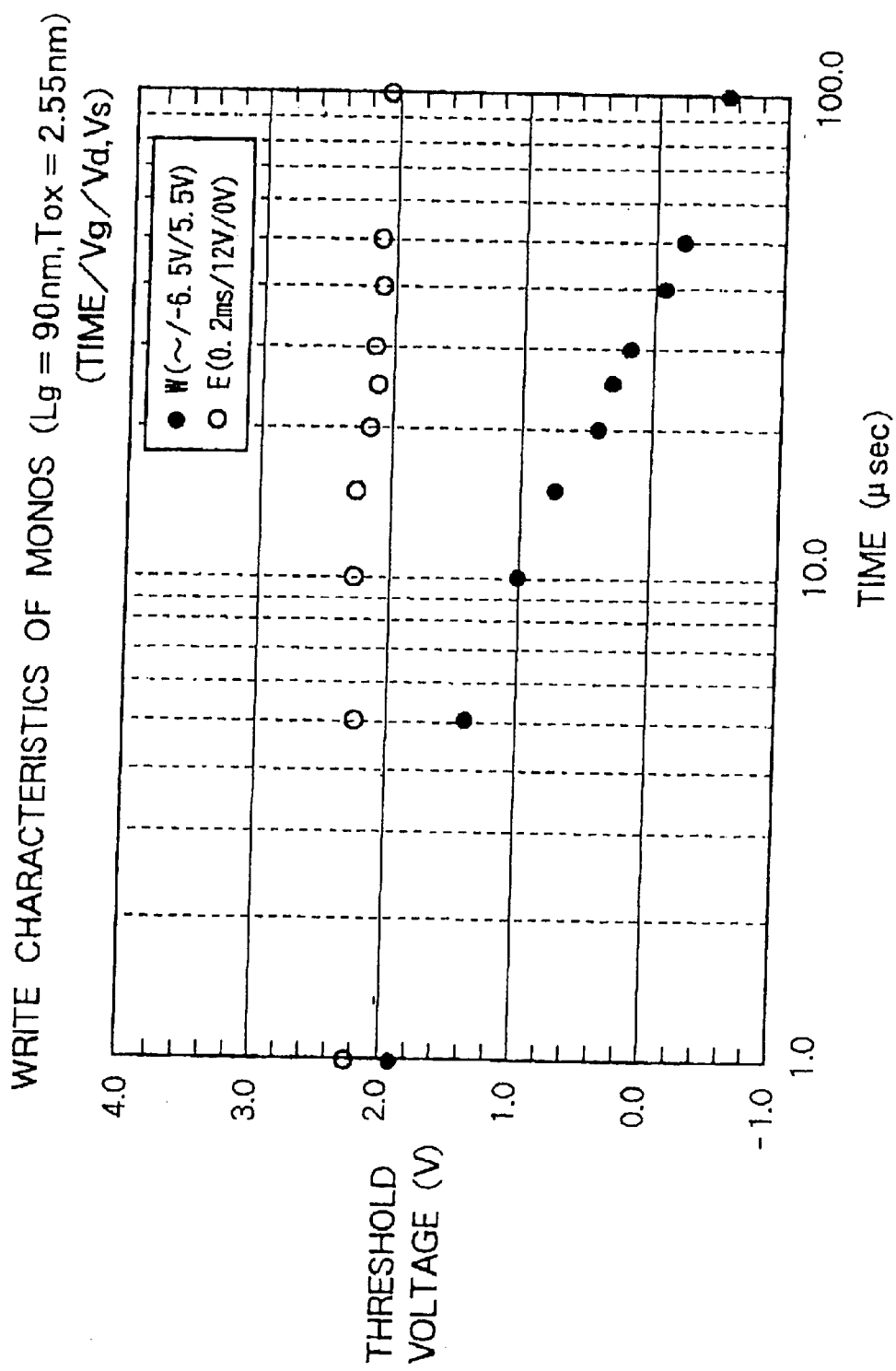
FIG. 12 is a graph showing the write characteristics of a 2.55 nm bottom insulating film in a memory transistor according to the first embodiment of the present invention.

FIG. 12 shows the write characteristics of a memory transistor having a bottom insulating film that is 2.55 nm in film thickness and 90 nm in gate length. The write condition is as follows: the gate voltage Vg is −6.5V, the source voltage Vs and drain voltage Vd are 5.5V, and the well voltage is 0V. It was also found that the threshold voltage decreased along with the increase of write time, and at 20 µs a sufficient reduction in the threshold voltage and high speed write operation could be obtained. The erasure condition includes that the gate voltage Vg is 12V, the source voltage Vs and drain voltage Vd are 0V, and the erasure time is 0.2 ms.

Therefore, for a memory transistor having a gate length as short as about 90 nm, it was found a sufficient reduction in the threshold voltage could be obtained when hot holes were locally injected from both the source and drain sides. Whereas, when the gate length is as long as 180 nm, under the above write and erasure conditions, the reduction of threshold voltage is not sufficient because holes are not injected into the center portion. It thus suggests that by shortening the gate length to 90 nm, the hole injection area is extended to the whole area of the plane of the charge storing means facing the channel and this largely contributes to the reduction of the threshold voltage.

Due to the above, a write speed of 20 µs is achieved in a MONOS transistor having a gate length of 90 nm.

The current-voltage characteristics of the memory transistor were studied in both the write and erasure states.

The results showed that at a drain voltage of 1.0V, because the nonselected word lines are biased by about −0.3 V in a read operation, the off leakage current from a nonselected cell was a small one of about 1 nA. Since in this case the read current is greater than 10 µA, a mistaken read of a nonselected cell does not happen. Thus, it was found there was a sufficient margin of the punch-through endurance voltage in a read operation in a MONOS type memory transistor with a gate length of 90 nm.

The read disturbance characteristic at a gate voltage of 1.5V was also evaluated. It was found that even after more than 3×10 seconds had passed, it was still possible to read the data.

Figure 13:
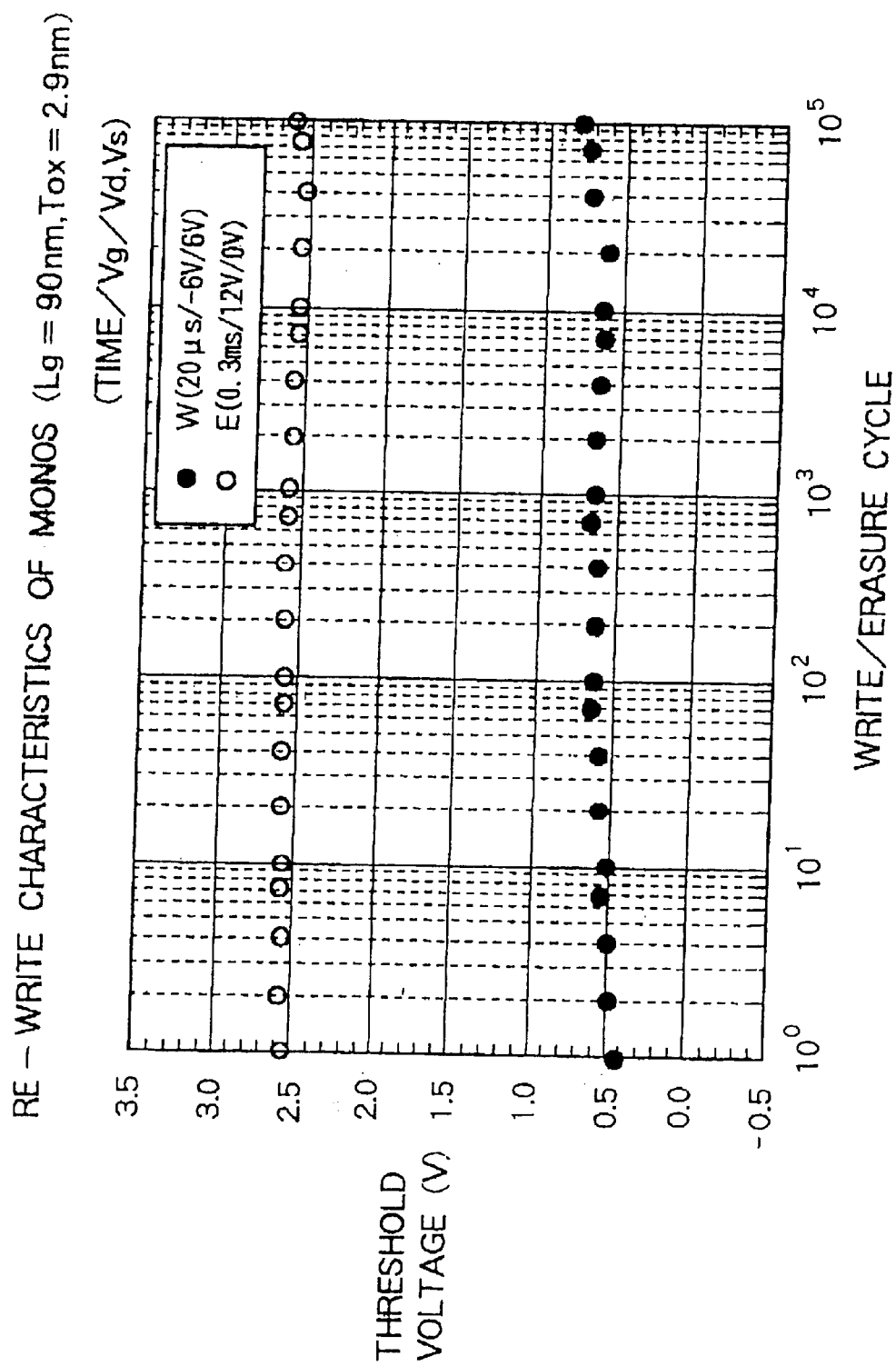
FIG. 13 is a graph showing the rewrite characteristics of a 2.9 nm bottom insulating film in a memory transistor according to the first embodiment of the present invention.

FIG. 13 shows the rewrite characteristics of a memory transistor having a bottom insulating film that is 2.9 nm in film thickness. The write and erasure conditions are the same as in FIG. 11. From FIG. 13, it is found the narrowing of the threshold voltage difference is small even after $10^5$ write-erasure cycles, and so the number of possible write-erasure cycles is to be more than 1×$10^5$.

Figure 14:
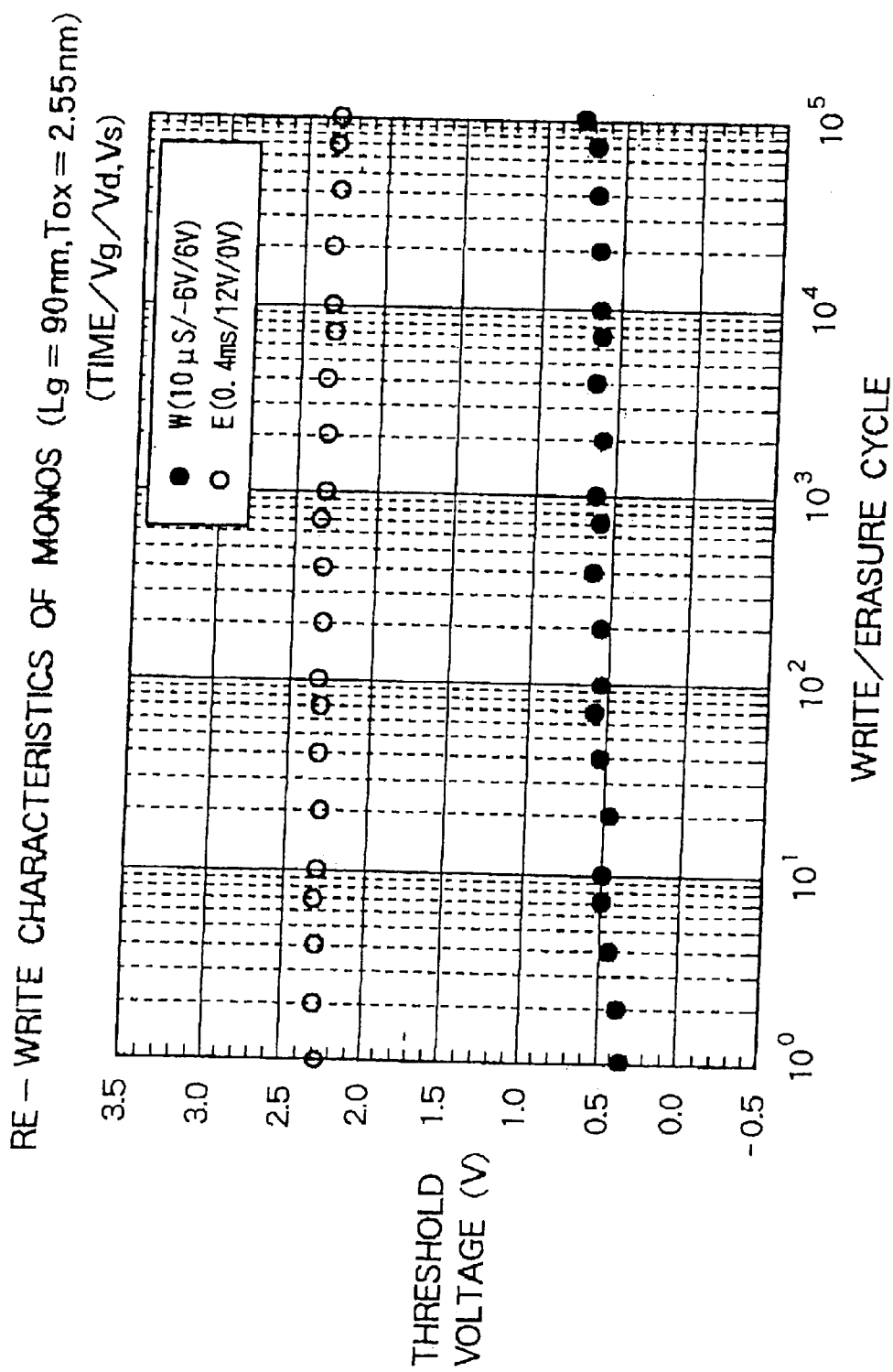
FIG. 14 is a graph showing the rewrite characteristics of a 2.55 nm bottom insulating film in a memory transistor according to the first embodiment of the present invention.

FIG. 14 shows the rewrite characteristics of a memory transistor having a bottom insulating film that is 2.55 nm in film thickness. As for the write condition, the bias voltage is the same as in FIG. 11, but the write time is shortened to 10 µs. For the erasure condition, the bias voltage is the same as in FIG. 12, but the erasure time is lengthened to 0.4 ms. From FIG. 14, it is found the number of possible write-erasure cycles is to be more than 1×$10^5$, and the same high reliability is achievable even when the thickness of the bottom insulating film is different.

Note that in all the above cases, it has been confirmed that a sufficient threshold voltage difference could be maintained even after 1×$10^6$ write-erasure cycles.

The data retention time is over 10 years at 85° C. after 1×$10^5$ write-erasure cycles.

From the above results, it was verified that a sufficiently high performance was achieved as an MONOS type nonvolatile memory transistor with a gate length of 90 nm.

Below, in the second to the fifth embodiments, descriptions are given of examples of modifications to the configuration and pattern of the memory cell array of the first embodiment.

Second Embodiment

Figure 15:
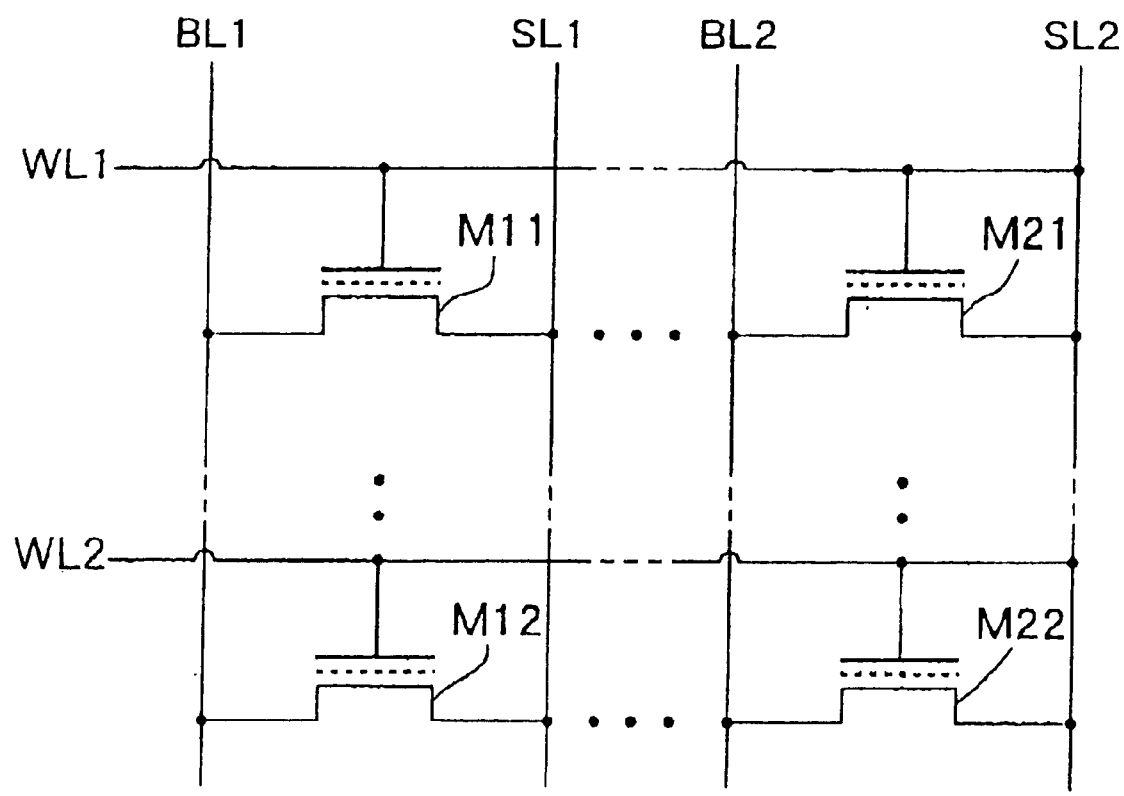
FIG. 15 is a circuit diagram of the configuration of a memory cell array of a nonvolatile semiconductor memory device according to a second embodiment of the present invention.

FIG. 15 is a circuit diagram of the configuration of a separate source line NOR type memory cell array of a nonvolatile semiconductor memory device according to the second embodiment.

In this nonvolatile memory device, each memory cell in the NOR type memory cell array is comprised of one memory transistor. As shown in FIG. 15, memory transistors M11 to M22 are arranged in a matrix. Word lines, bit lines, and separated source lines are arranged between adjacent transistors.

Namely, the drains of adjacent memory transistors M11 and M12 in the bit line direction are connected to a bit line BL1, while their sources are connected to a source line SL1. Similarly, the drains of adjacent memory transistors M21 and M22 in the bit line direction are connected to a bit line BL2, while their sources are connected to a source line SL2.

Further, the gates of adjacent memory transistors M11 and M21 in the word line direction are connected to a word line WL1. Similarly, the gates of adjacent memory transistors M12 and M22 in the word line direction are connected to a word line WL2.

Such a cell arrangement and connections between cells are repeated in the entire memory cell array.

Figure 16:
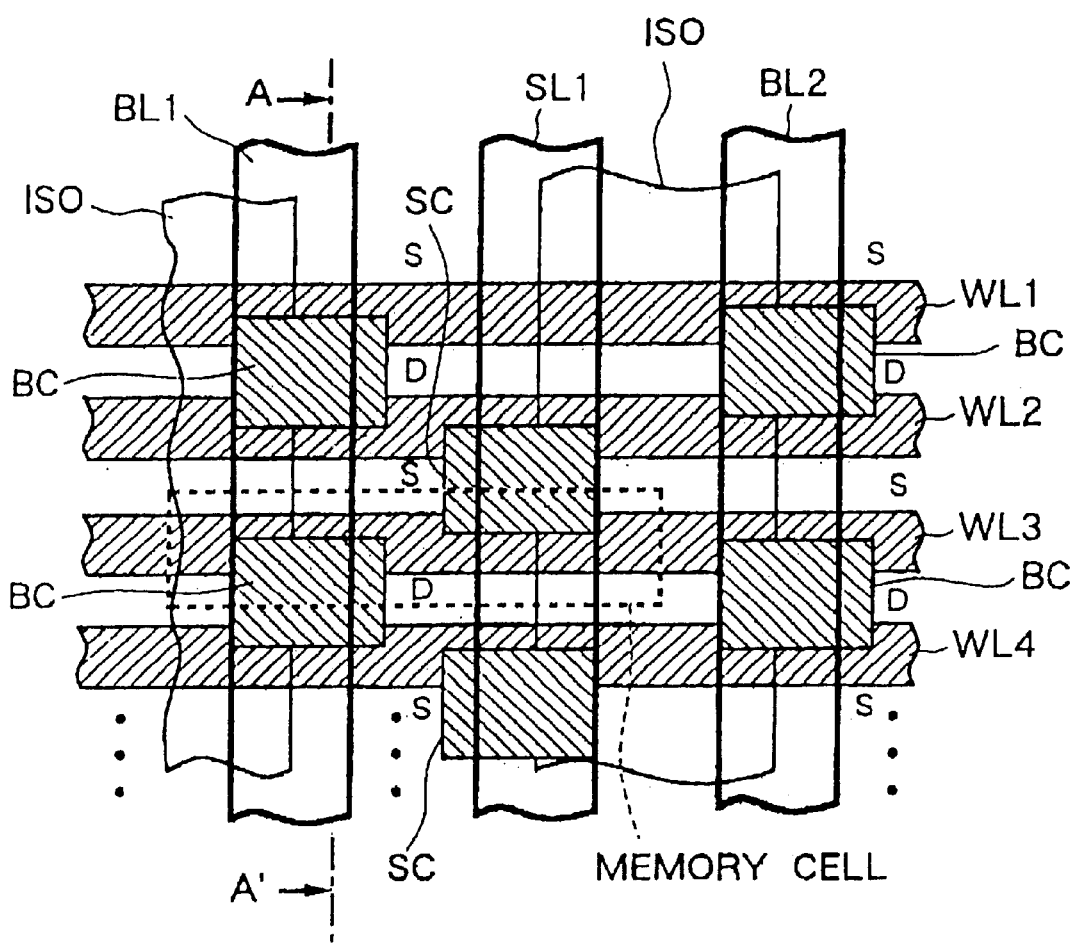
FIG. 16 is a plan view of a separate source line NOR type memory cell array according to the second embodiment of the present invention.
Figure 17:
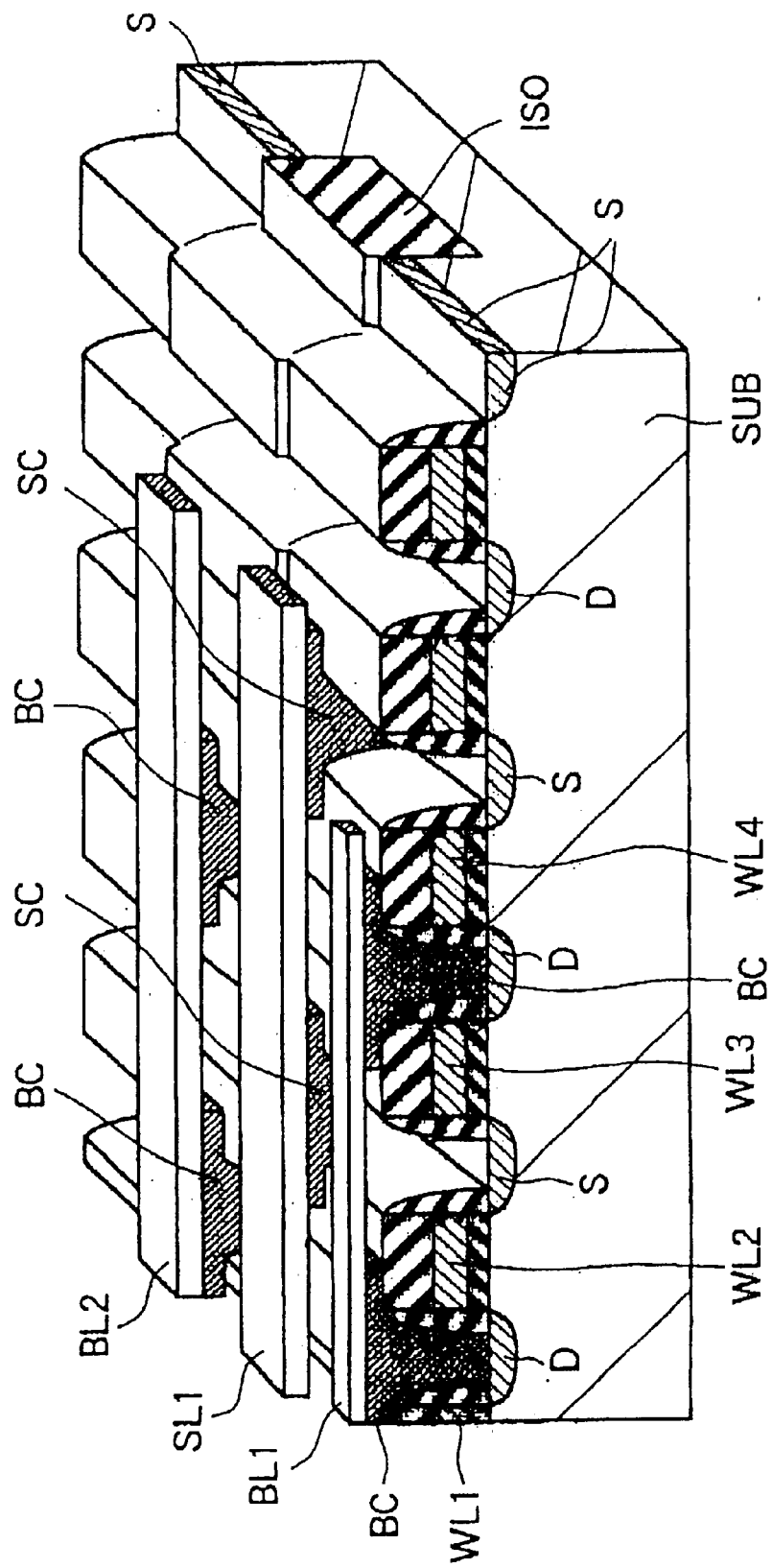
FIG. 17 is a cross-sectional bird's-eye view of the separate source line NOR type memory cell array according to the second embodiment of the present invention along the line AA' shown in FIG. 16.

FIG. 16 is a schematic plan view of a miniature NOR type memory cell array according the second embodiment, while FIG. 17 is a cross-sectional bird's-eye view along the line A–A' shown in FIG. 16.

In this miniature NOR type memory cell array, as shown in FIG. 17, the element isolation layers ISO are formed by trenches or LOCOS in the surface of a p-type semiconductor substrate SUB (a p-well is also usable). As shown in FIG. 16, the element isolation layers ISO are arranged in parallel stripes in the bit line direction (vertical direction in FIG. 15). Substantially perpendicular to the element isolation layers ISO, word lines WL1, WL2, WL3, WL4 . . . are arranged at regular intervals. As in the first embodiment, such word lines are made by stacking a polysilicon or other gate electrode on a gate insulating film comprised of a bottom insulating film, a nitride film, and a top insulating film.

In the active region between adjacent element isolation layers ISO, an impurity of opposite conductive type to the substrate SUB is introduced at a high concentration into the regions between adjacent word lines to form the source impurity region S and drain impurity region D alternately. The sizes of S and D in the word line direction (the horizontal direction in FIG. 15) are determined only by the interval of adjacent element isolation layers ISO. In the bit line direction, they are determined only by the interval of adjacent word lines. Therefore, the source impurity region S and the drain impurity region D can be formed extremely uniformly since almost no size and arrangement fluctuations caused by mask alignment are introduced.

Word lines are covered by insulating layers on their upper surfaces and sidewalls. Namely, in the same pattern, the offset insulating layers are formed on the upper surfaces of word lines WL1, WL2, . . . . The sidewall insulating layers are formed on the two sidewalls of the stacked patterns including the offset insulating layers, and thereunder the gate electrodes (word lines) and the gate insulating films.

Because of the formation of the offset insulating layers and the sidewall insulating layers, there appears long and narrow spaces along the word lines between adjacent word lines acting as self alignment contact holes.

Conductive materials are alternately buried into the self alignment contact holes so as to partly overlap the source impurity region S or the drain impurity region D. Due to this, bit contacts BC and source contacts SC are formed.

In the formation of these contacts BC and SC, the conductive materials are deposited until the entire regions of the self alignment contact holes are buried and resist patterns used for etching masks are formed over them. At this time, resist patterns are formed one size larger than the width of the self alignment contact holes. Further, parts overlap with the element isolation film. Then, the resist patterns are used as masks and the conducive materials around the resist patterns are removed by etching. Due to this way, two kinds of contacts BC and SC are formed at one time.

The depressions surrounding the contacts are buried with not shown insulating films. On these insulating films, bit lines BL1, BL2, . . . in contact with the bit contacts BC and source lines SL1, . . . in contact with the source contacts SC are formed alternately in parallel stripes.

In this miniature NOR type cell array, the contacts for bit lines or source lines are formed by forming the self alignment contact holes and forming the plugs. In the formation of the self alignment contact holes, the isolation from the word lines is achieved and the exposed surfaces of the source impurity regions S or the drain impurity regions D are uniformly formed. Further, the bit contacts and the source contacts are formed on the exposed surfaces of the source impurity regions S or of the drain impurity regions D inside the self alignment contact holes. Therefore, the size of the surface of each plug contacting the substrate in the bit line direction is substantially determined by the formation of the self alignment contact holes. Thus, there is little variation in the contact areas.

It is easy to isolate the bit contacts BC or the source contacts SC from the word lines. That is, the offset insulating layers are formed at one time when forming the word lines, then the sidewall insulating layers are formed by just forming the insulating films and etching the entire region (etchback).

In addition, since the bit contacts BC and the source contacts SC, or the bit lines and the word lines are severally formed by patterning the same layer of conductive film, the interconnection structure is extremely simple, and the number of processes is small, and therefore this structure is advantageous in maintaining low manufacturing costs.

Further, since there is almost no wasted space, if each layer is formed at the minimum line width F of the limit in the wafer process, very small cells of areas close to $8F^2$ can be fabricated.

The basic structure of the MONOS type memory transistor according to the second embodiment is the same as that of the first embodiment. In the memory transistor according to the second embodiment, however, the facing direction between the source impurity regions S and drain impurity regions D, that is, the channel direction, is perpendicular to the direction of the word lines WL. Therefore, the gate length is substantially determined by the width of the word lines.

In the fabrication of memory transistors of this structure, the major difference from the first embodiment is that source and drain impurity regions S and D are formed after the formation of the word lines. That is, after the formation of the element isolation layers ISO, and formation and processing of the gate insulating films and the gate electrodes in the same way as in the first embodiment, the source impurity regions S and the drain impurity regions D are formed by ion implantation by self alignment with the formed patterns.

Next, to construct the structure of the memory cell array shown in FIG. 17, self alignment contact holes are formed together with the sidewall insulating films, then the bit contacts BC and the source contacts SC are formed on the source impurity regions S and the drain impurity regions D exposed through the self alignment contact holes.

Then, the areas surrounding the contacts are buried with interlayer insulating films. Bit lines and source lines are formed on the interlayer insulating films, then when necessary upper layer interconnections are formed over the interlayer insulating films, an overcoat is formed, pads are made, etc. to complete the nonvolatile memory cell array.

In the first embodiment, the transistor's source and drain voltages are transmitted to the sub-bit lines SBL and the sub-source lines SSL through the select transistors.

In the present embodiment, the voltages transmitted to the sub-bit lines SBL arid the sub-source lines SSL in the first embodiment are directly applied to the bit lines BL and the source lines SL. Therefore, operations the same as those in the first embodiment, that is, write, read, and erasure, become possible. The procedure of injecting charges in the transistors is the same as the first embodiment, so the detailed explanation is omitted.

As a modification of the present embodiment, even the source lines and/or the bit lines are formed from the semiconductor impurity regions in the same way as the first embodiment and these impurity regions are connected to metal interconnections through contacts for every 32 to 128 memory cells, the same effects as the first embodiment can be achieved.

Third Embodiment

The third embodiment relates to a modification of the aforesaid memory cell array configuration of the second embodiment.

Figure 18:
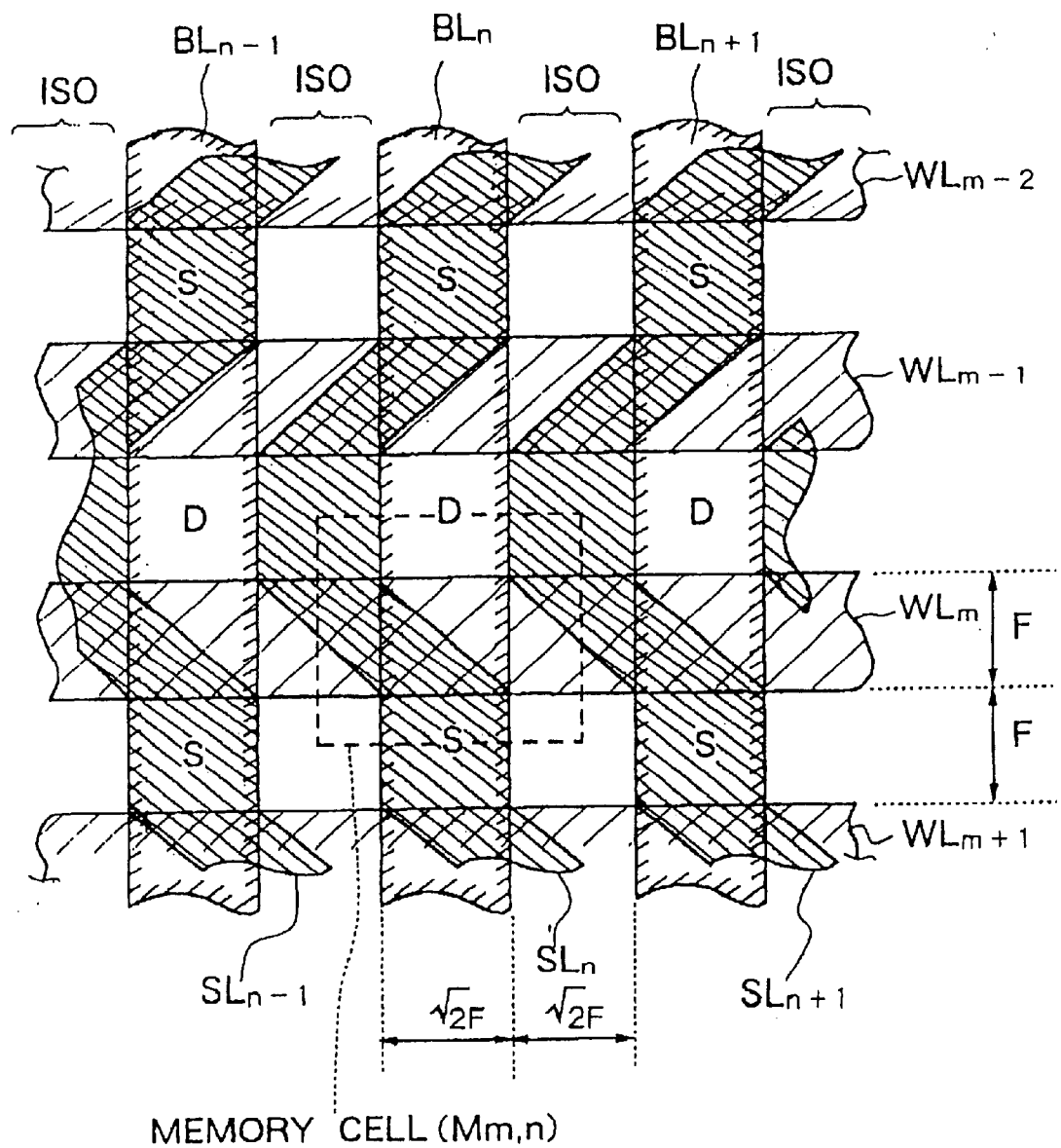
FIG. 18 is a plan view of a separate source line NOR type memory cell array according to a third embodiment of the present invention.

FIG. 18 is a schematic plan view of a miniature NOR type memory cell array using self alignment and serpentine source lines.

In this NOR type memory cell array, on the surface of a not shown p-well, vertical stripe trenches or LOCOS or other element isolation layers ISO are arranged at regular intervals in the bit line direction (vertical direction in FIG. 18). Substantially perpendicular to the element isolation layers ISO, word lines $WL_{m-2}$, $WL_{m-1}$, $WL_m$, $WL_{m+1}$ are arranged at regular intervals. The structure of a word line, in the same way as shown in the previous embodiments, is formed by stacking a bottom insulating film, a nitride film, a top insulating film, and a gate electrode.

In the active regions between adjacent element isolation layers ISO, for example, an n-type impurity is introduced at a high concentration to alternately form source impurity regions S and drain impurity regions D. The sizes of the source impurity regions S and the drain impurity regions D in the word line direction (horizontal direction in FIG. 18) are determined only by the intervals of adjacent element isolation layers ISO, while the sizes in the bit line direction are determined only by the intervals of adjacent word lines. Therefore, the source impurity regions S and the drain impurity regions D are formed extremely uniformly since almost no size and arrangement fluctuations caused by mask alignment are introduced.

Around each word line, by just forming the sidewall insulating films, contact holes for connecting bit lines and contact holes for connecting source lines are formed on the source impurity regions S and the drain impurity regions D by applying two self-alignment contact steps. Moreover, the above process does not require a photomask. Therefore, as described above, not only are the source regions and drain regions uniform in size and arrangement, but also the contact holes for connection of the bit lines or the source lines formed by self alignment in two dimensions are extremely uniform in size. Furthermore, the contact holes have substantially the maximum areas relative to the areas of the source regions S and the drain regions D.

The source lines $SL_{n-1}$, $SL_n$, and $SL_{n+1}$ (hereinafter, indicated by SL) arranged in the bit line direction are arranged in a serpentine fashion on the element isolation layers ISO and source impurity regions S while avoiding the drain impurity regions D and are connected to the lower layer source impurity regions S through the contact holes for source line connection. The bit lines $BL_{n-1}$, $BL_n$, and $BL_{n+1}$ (hereinafter indicated by BL) are arranged at equal intervals on the source lines SL through the second interlayer insulating film. The bit lines BL are positioned above the active regions and are connected to the lower layer drain regions through contact holes for bit line connection.

In a cell pattern of such a configuration, as explained above, since the source regions and drain regions can be formed without being affected much by mask alignment, and the contact holes for bit line connection and contact holes for source line connection are formed by applying two self-alignment steps, the contact holes are not elements restricting the reduction of the cell area, so it is possible to arrange sources at the minimum line width F of the limit in the wafer process and there is almost no wasted space, so it is possible to realize an extremely small cell area close to $6F^2$.

Fourth Embodiment

The fourth embodiment relates to a so-called virtual grounding type common source line NOR type nonvolatile memory device.

Figure 19:
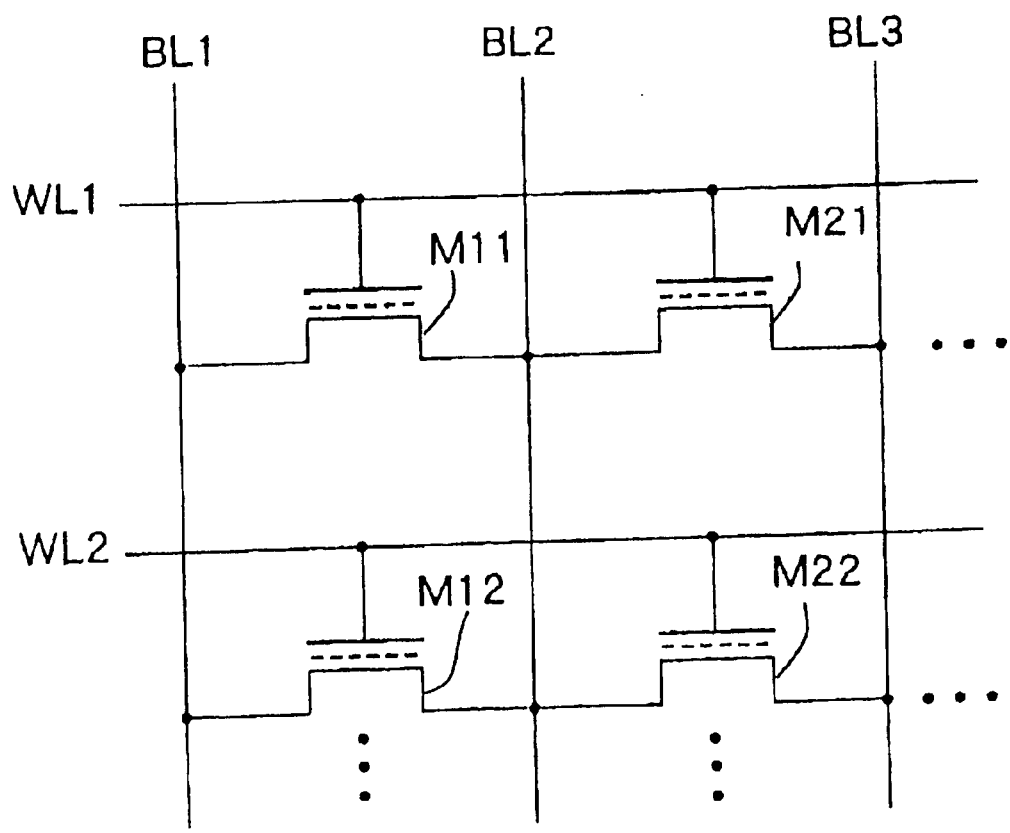
FIG. 19 is a circuit diagram of the configuration of a memory cell array of a nonvolatile semiconductor memory device according to a fourth embodiment of the present invention.
Figure 20:
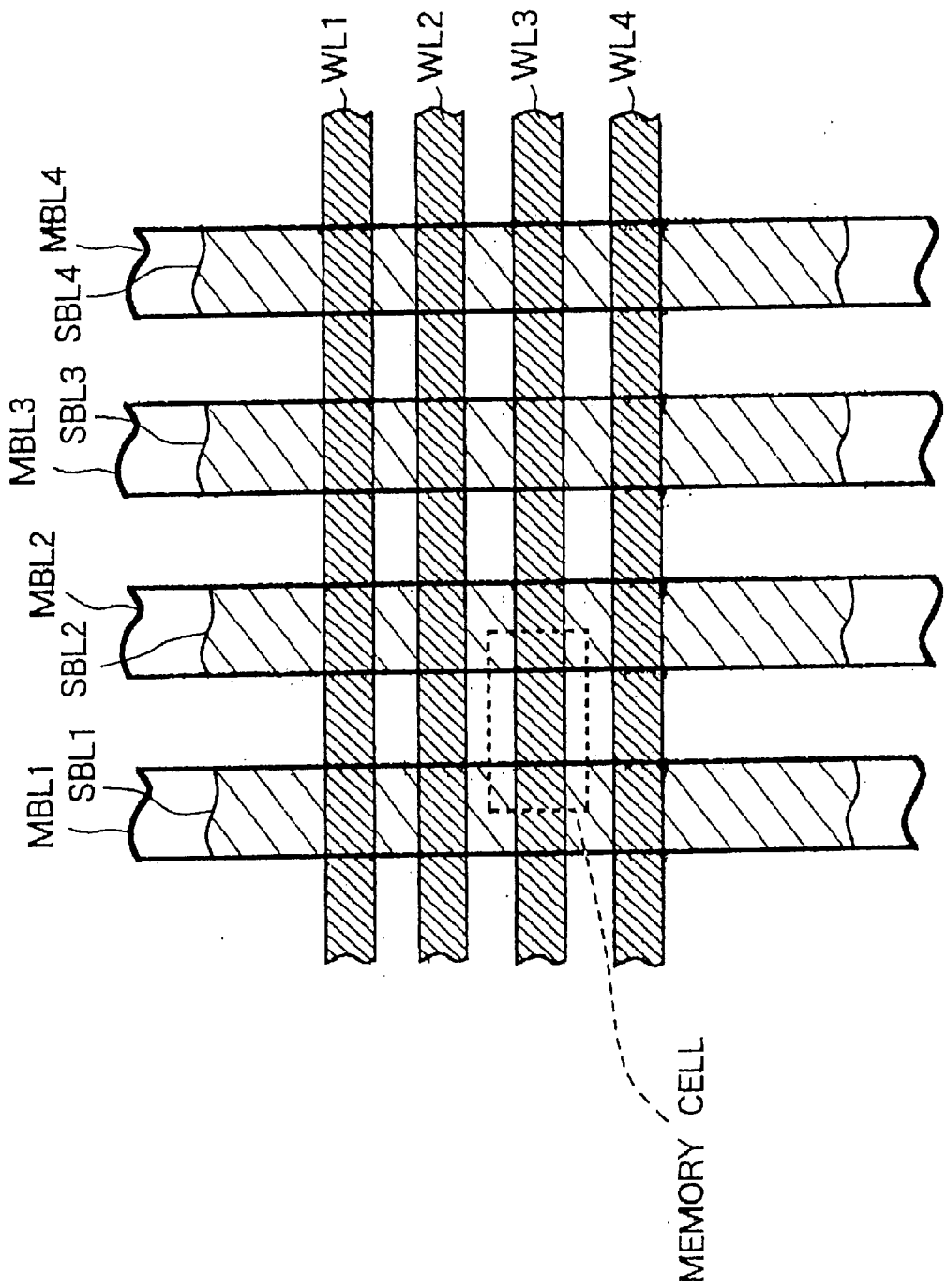
FIG. 20 is a plan view of a common source line NOR type memory cell array according to the fourth embodiment of the present invention.

FIG. 19 is a circuit diagram for illustrating the configuration of a virtual grounding NOR type memory cell array. FIG. 20 is schematic plan view of the virtual grounding NOR type memory cell array.

In this memory cell array, unlike that shown in FIG. 15, the source lines are not separated, here the source line is shared. This shared source line functions as a bit line when the adjacent memory cell is operated. Therefore, in this memory cell, all lines in the bit line direction are called bit lines.

As shown in FIG. 20, each bit line (BL1 to BL3) is comprised of a diffusion layer connection formed from a semiconductor impurity region (sub-bit lines SBL1, SBL2, . . . ) and a metal connection (main bit lines MBL1, MBL2, . . . ) connected to a sub-bit line SBL1, SBL2, . . . through a not shown bit contact.

In this pattern of the memory cell array, there is no element isolation ISO at all, so the cell area is reduced by that extent compared with the first to third embodiments.

Note that one of every other bit lines, for example, BL1 and BL3, may be connected to the upper layer metal interconnections through not shown bit contacts.

In the present embodiment, the voltage transmitted to the sub-bit lines SBL and the sub-source lines in the first embodiment is directly applied to the bit lines BL and the source lines SL. Therefore, write, read, and erasure operations the same as those in the first embodiment are possible. The procedure of injecting charges in the transistors is the same as the first embodiment, so a detailed explanation is omitted.

In the virtual grounding NOR type, because the source lines are shared, in general there arises a problem of a mistaken write to the adjacent memory transistors in the word line direction. However, in the present invention, there is a large change in the threshold voltage only after charges are injected from both the source and the drain sides, so there is the advantage that there is seldom a mistaken write to adjacent nonselected memory transistors in the word line direction.

Fifth Embodiment

The fifth embodiment relates to a common source line NOR type nonvolatile memory device similar to the HiCR type in an FG type.

Figure 21:
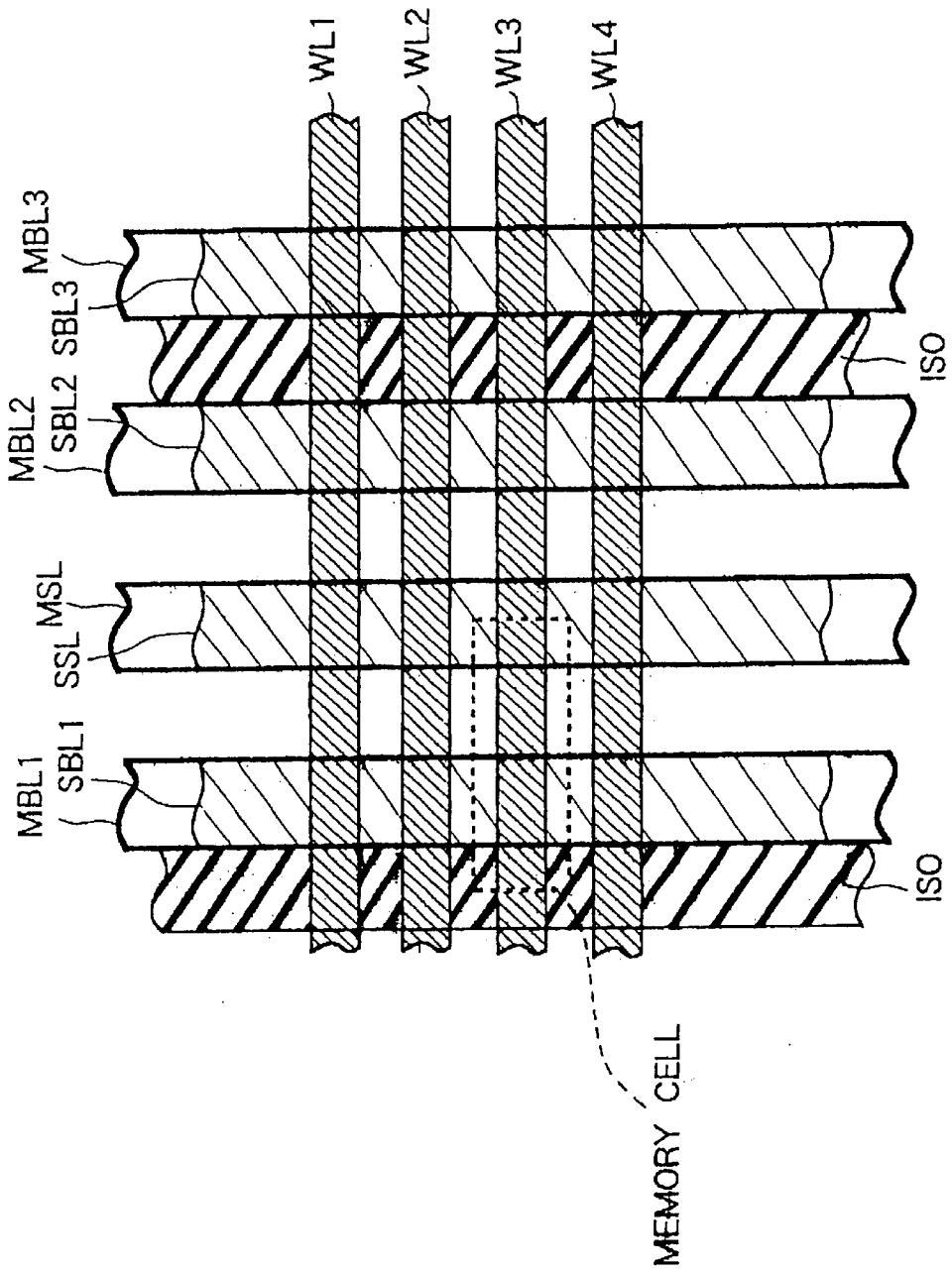
FIG. 21 is a plan view of a common source line NOR type memory cell array according to a fifth embodiment of the present invention.

FIG. 21 is schematic plan view of a memory cell array according to the fifth embodiment. The circuit diagram of the memory cell array is the same as that in FIG. 19 for the fourth embodiment.

In this memory cell array, as shown in FIG. 21, source lines (main source lines MSL and sub-source lines SSL) are arranged in common between two adjacent memory transistors in the word line direction. Therefore, element isolation layers ISO are provided for every three sub lines (sub-bit lines SBLn and SBLn+1 and sub-source line SSL).

In this pattern of the memory cell array, there are fewer element isolation layers ISO than in the first to third embodiments, so the cell area is reduced by that extent compared with the first to third embodiments.

In the present embodiment, the voltage transmitted to the sub-bit lines SBL and the sub-source lines in the first embodiment is directly applied to the main bit lines MBL and the source lines MSL. Therefore, write, read, and erasure operation the same as those in the first embodiment are possible. The procedure of injecting charges in the transistors is the same as the first embodiment, so a detailed explanation is omitted.

In addition, in the same way as the virtual grounding NOR type, because there is only a large change in the threshold voltage after charges are injected from both the source and the drain sides, there is the advantage that there is seldom a mistaken write to adjacent nonselected memory transistors in the word line direction.

Below, descriptions are given of embodiments of memory cells having structures suitable for writing two bits in one cell.

Sixth Embodiment

The sixth embodiment relates to a separated source line NOR type nonvolatile memory suitable for writing two bits in one cell.

Figure 22:
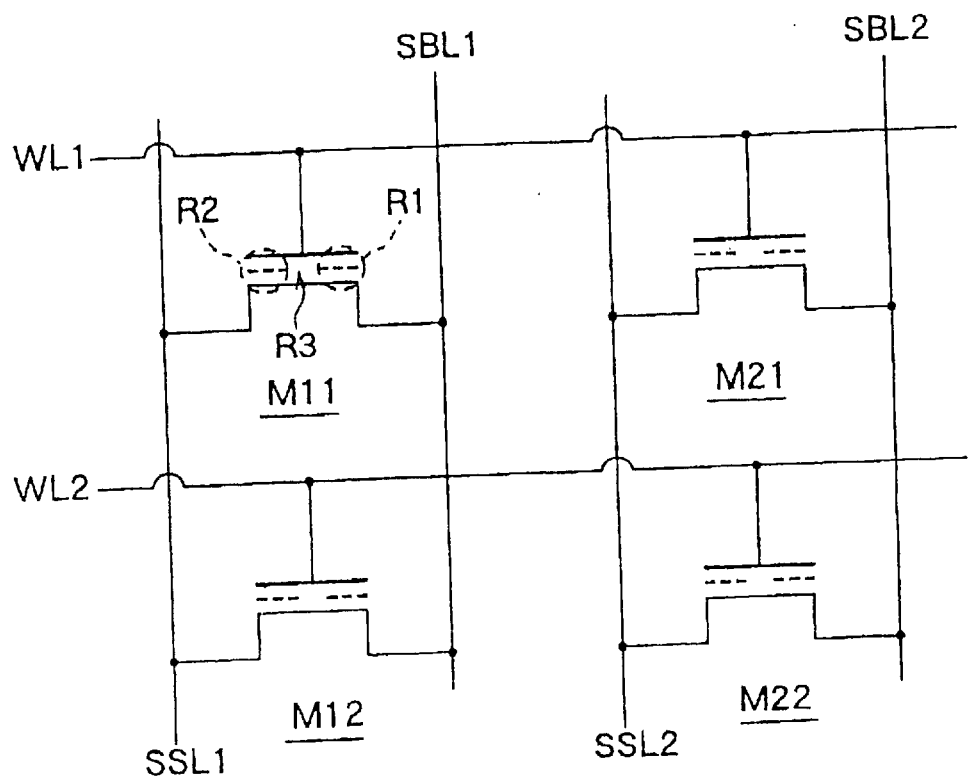
FIG. 22 is a circuit diagram of four cells of a common source line NOR type memory cell array according to a sixth embodiment of the present invention.
Figure 23:
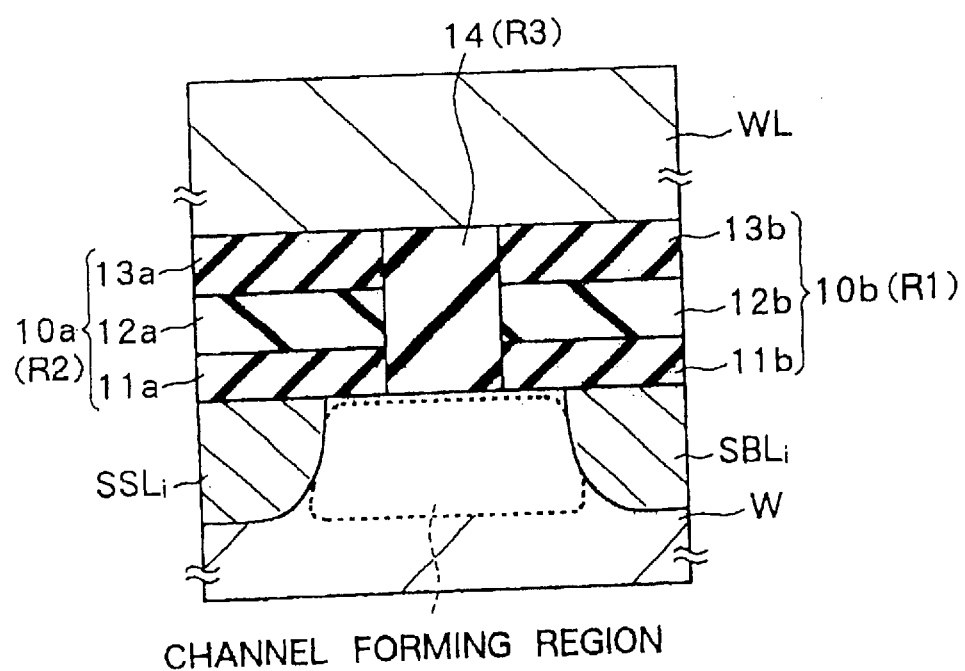
FIG. 23 is a cross-sectional view illustrating the structure of a memory transistor according to the sixth embodiment of the present invention.

FIG. 22 shows the circuit diagram of four cells in a memory cell array. This memory cell array is an enlargement of the principle part of the memory cell array in FIG. 1. FIG. 23 is a cross-sectional view for illustrating the structure of the memory transistor according to the sixth embodiment.

In the memory transistor shown in FIG. 23, the gate insulating film consists of a gate insulating film 10a at the side of the sub-bit line SBLi and a gate insulating film 10b at the side of the sub-source line SSL1. The two gate insulating films 10a, 10b are spatially separated by a single layer gate insulating film 14 on the central portion of the channel.

The gate insulating films 10a and 10b have the same structure as gate insulating film 10 in the first embodiment. That is, the gate insulating film 10a consists of a bottom insulating film 11a (FN tunneling nitride film), a nitride film 12a, and a top insulating film 13a in order from the bottom. Similarly, the gate insulating film 10b consists of a bottom insulating film 11b (FN tunneling nitride film), a nitride film 12b, and a top insulating film 13b in order from the bottom.

The bottom insulating films 11a, 11b, nitride films 12a, 12b, and top insulating films 13a, 13b are comprised of the same materials, of the same thicknesses, by using the same methods as the bottom insulating film 11, nitride film 12, and top insulating film 13 in the first embodiment, respectively.

Here, in the gate insulating film 10b, the region including the nitride film 12b and its surroundings is referred to as "the first region R1", in the gate insulating film 10a, the region including the nitride film 12a and its surroundings is referred to as "the second region R2", and the region of the gate insulating film 14 is referred to as "the third region R3".

In the present embodiment, the region of distribution of each charge storing means (carrier traps) is split into the spatially separated first region R1 and second region R2 and a single layer of a dielectric between them (third region R3). As a result, there is formed an element structure in which a memory transistor having two mutually separated memory regions and a MOS transistor formed between the two memory regions and shares a common gate electrode with the memory transistor are integrated.

This structure has various advantages. One of them is that the charge injection area is confined, so over injection of charges hardly ever happens. Another advantage, as explained later, is that the ON/OFF state of the channel can be controlled through a MOS type control transistor of a constant threshold voltage in addition to having transistors of a variable threshold voltage. Furthermore, there is the large advantage that even at a high temperature the stored charge does not diffuse in the transverse direction, therefore the reliability is superior.

The gate insulating film 14 between the gate insulating films 10a and 10b is comprised of a silicon oxide film formed by, for example, CVD and buries the space between the gate insulating films at the two sides.

As an example showing one of the various methods of forming such a gate insulating film structure, first, in the same way as in the first embodiment, after the stacked film of a bottom insulating film (FN tunneling nitride film), a nitride film, and a top insulating film is formed on the entire area, part of the stacked films above the central portion of the channel forming region is removed by etching, so gate insulating film 10a and 10b are formed spatially separated. Then, silicon oxide film is thickly deposited on the entire area and etchback is performed on the surface of the silicon oxide film. The etchback is stopped when the insulating film on the gate insulating films 10a and 10b is removed and the gate insulating film 14 buries just the space between the gate insulating films 10a and 10b, whereupon the desired gate insulating film structure is completed. In order to prevent over-etching, an etching stopper film, for example, a thin silicon nitride film, may be formed beforehand on the gate insulating films 10a and 10b.

Next, in the same way as in the first embodiment, after the process of forming word lines WL etc., the memory transistor is completed.

Next, the operation of a nonvolatile memory of such a configuration will be explained by taking as an example a plurality of memory transistors M11, M21, . . . connected to the word line WL1.

Figure 24A:
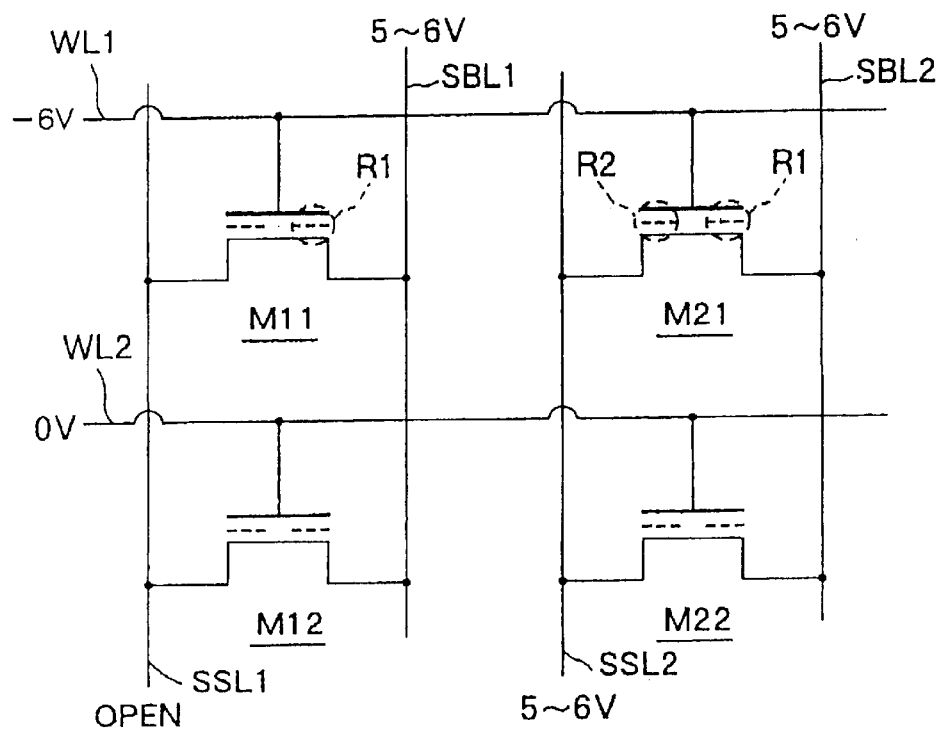
Figure 24B:
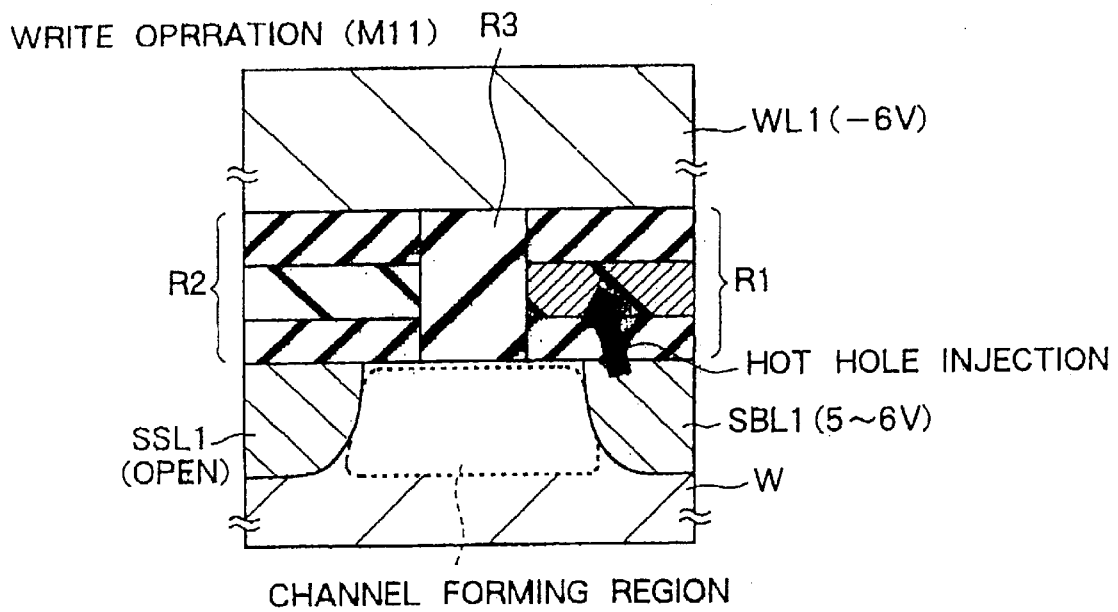
FIG. 24B is a cross-sectional view of the transistor showing the write operation.
Figure 25A:
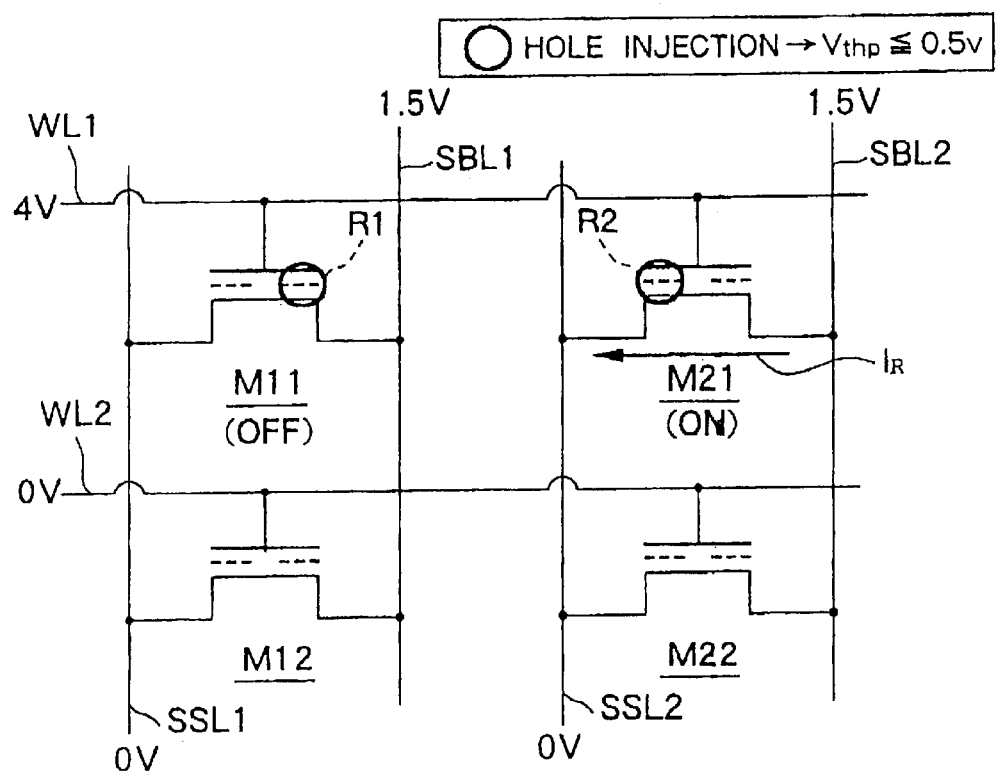
FIGS. 25A and 25B are circuit diagrams of the read bias conditions of a memory transistor according to the sixth embodiment of the present invention.
Figure 25B:
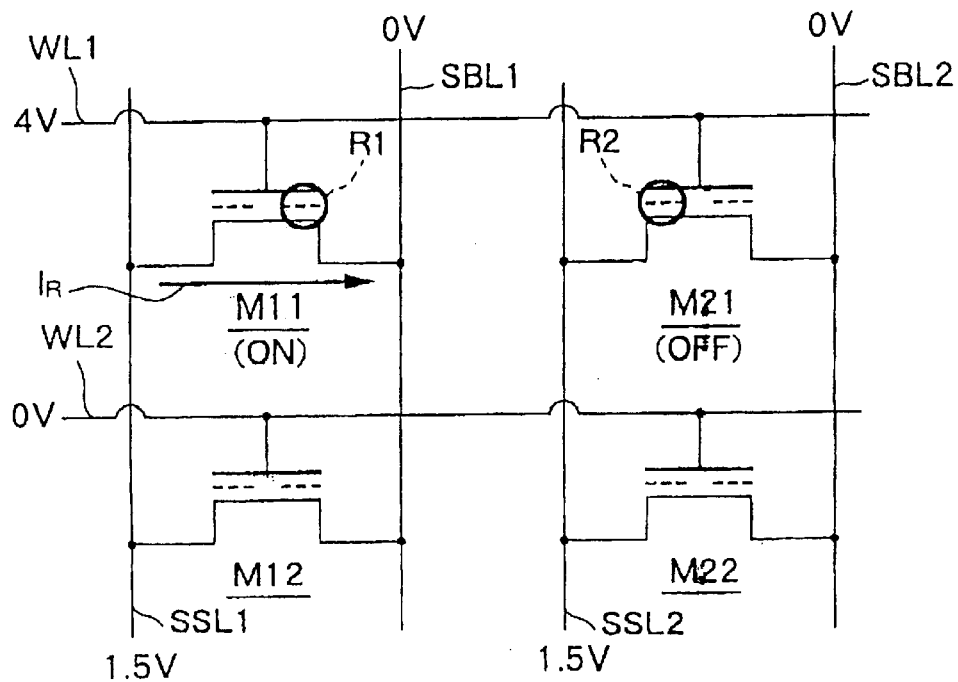
Figure 26A:
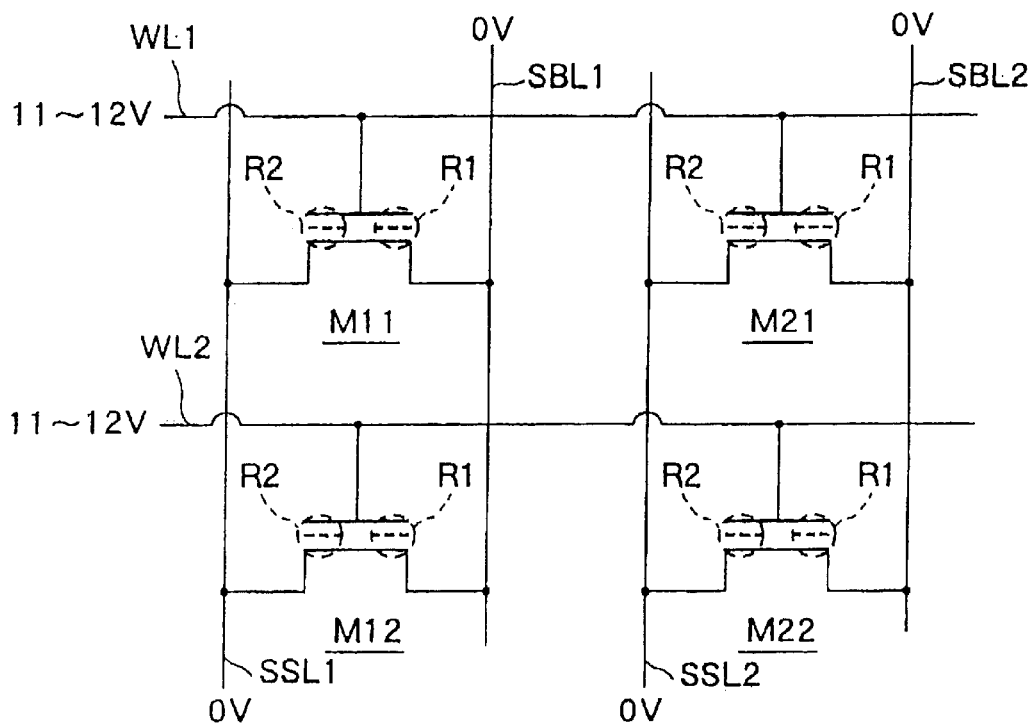
Figure 26B:
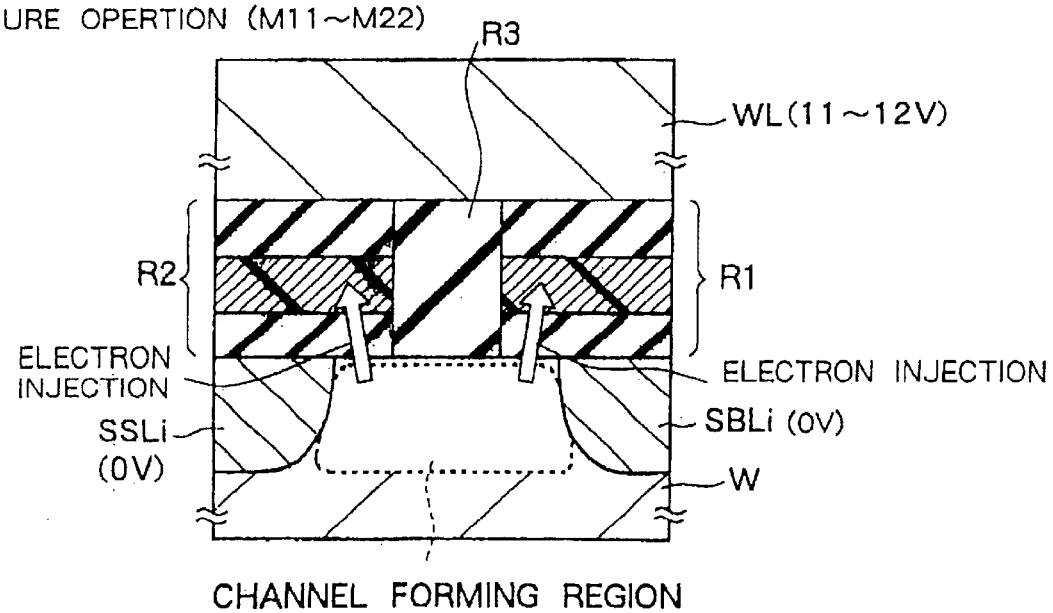
FIG. 26B is a cross-sectional view of the transistor showing the erasure operation.

FIG. 24A is a circuit diagram showing the bias conditions of a write operation, while FIG. 24B is a cross-sectional view of a transistor showing a write operation, FIGS. 25A and 25B are circuit diagrams showing the bias conditions of a read operation, FIG. 26A is a circuit diagram showing the erasure bias conditions, and FIG. 26B is a cross-sectional view of a transistor showing an erasure operation.

In a write operation, memory cells connected to the same word line (here, WL1) can be written simultaneously. As shown in FIGS. 24A and 24B, the pattern of the voltages applied to the sub-bit lines SBL1, SBL2, . . . and the sub source lines SSL1, SSL2, . . . is determined according to which side of the first and the second regions R1, R2 is to be written. In more detail, in FIGS. 24A and 24B, if injecting hot holes into the first region R1 of the memory transistor M11 and the first and second regions R1, R2 of the memory transistor M21, a specified positive voltage of, for example, 5V to 6V or so is applied to the sub-bit lines SBL1, SBL2 and the sub-source lines SSL2. Other sub-lines not to be injected with hot holes (here, the sub-source line SSL1) are set open and are in an electrically floating state.

Further, a specified negative voltage of, for example, −6V, is applied to the selected word line WL1, while a specified write inhibit voltage of, for example, 0V, is applied to the nonselected word lines WL2 to WLn. 0V is also applied to the substrate (p-well W).

Under these write conditions, in the row of memory transistors to which data is to be written, due to the application of a negative voltage to the selected word line WL1, the surface of the n-type impurity regions as the sub-bit lines SBL1, SBL2 and sub-source line SSL2 on which the positive voltage (5V to 6V) is applied, is deeply depleted and the energy bands bend sharply. Because of the band-to-band tunnel effect, electrons in the valence band tunnel to the conduction band and flow into the n-type impurity region, and holes are generated. Those holes drift more or less to the center of the channel forming region and are accelerated by the electric field there, whereby part become hot holes. The moments (magnitude and direction) of the high energy charges (hot holes) generated in the n-type impurity region are maintained and their kinetic energies are not lost much at all, therefore the holes are injected into the carrier traps formed as the charge storing means at a high speed and with a high efficiency.

As a result, the threshold voltage of the memory transistor is reduced from Vthe=2.0V to 2.5V in the erasure state to Vthp.ltoreq.0.5V in the write state.

On the other hand, in the nonselected row of memory transistors M12, M22, . . . . only 5 to 6V is applied between the gate and the source or the drain, so holes are not injected into the charge storing means, and write is effectively inhibited.

In such a write process, because the charge acceleration direction is substantially the same as the injection direction, the injection efficiency is higher than the conventional CHE injection. In addition, because a channel is not formed during the write operation, the current consumption is low. Although the current is small, because charges are injected into substantially the entire area of the plane of distribution of the charge storing means, the write time for obtaining the necessary change of the threshold voltage is, for example, less than 20 μs or reduced by more than one order of magnitude when compared with the conventional case.

Moreover, in this write process, the charge injection from the n-type impurity region serving as the sub-bit line SBL1 and the charge injection from the n-type impurity region serving as the sub-source line SSL1 are both localized. That is, in the present embodiment, the charge injection area is confined to the first region R1 or the second region R2, therefore over-write is prevented.

Furthermore, a page write can be performed with only one operation of setting a combination of the voltages applied to the sub-lines SBL and SSL and lowering the potential on the word line. Due to the aforesaid improvement of the injection efficiency, the write current per bit is decreased by more than one order of magnitude, so the number of cells able to be written in parallel simultaneously is increased to one kilobyte (kB) in the present embodiment, whereas it is only one byte of cells with the conventional CHE injection.

When not writing a page, the selected rows of cells to be written and the nonselected rows of cells to be inhibited may be differentiated using the bias conditions. It is therefore possible to write on only the selected rows of cells.

The read operation is basically a page read.

As shown in FIG. 25A, when the bits of the second regions R2 are to be read, a specified drain voltage of, for example, 1.5V is applied to the sub-bit source lines SBL1, SBL2, . . . , while 0V is applied to the sub-source lines SSL1, SSL2, . . . and the substrate. In addition, a specified read inhibit voltage, for example, 0V is applied to the nonselected word lines WL2, WL3 . . . Under these conditions, a specified read gate voltage of, for example, 4.5V, is applied to the word line WL1 to be read.

In this way, when the second regions R2 of the memory transistors M21. . . . are connected to the word line WL1 are in a write state, the memory transistors M21, are turned on, the read current $I_R$ flows as illustrated, and the voltage of the sub-bit line changes. On the other hand, in a memory transistor M11 whose second region R2 is not in a write state, the threshold voltage remains at a high level, and the memory transistor remains off.

Next, the change of the voltage on the sub-bit line SBL2 etc. caused by flowing of its pre-charges to the source line through the ON memory transistor is amplified by a not shown sense amplifier and read.

The first region R1 can be read by applying a 1.5V drain voltage in the opposite direction to the above.

In the transistor structure of the first embodiment where there is no MOS transistor in the central portion of the channel, when holes are over-injected and the threshold voltage of the memory transistor is largely decreased, the read current fluctuates and further there is much unnecessary current consumption.

With a structure including a MOS transistor formed in the central portion of the channel (third region R3) such as in the present embodiment, the threshold voltage Vth (MOS) of the MOS transistor in the third region R3 is set in advance in the range of for example 0.5 to 0.6V. As a result, even if over-write to a memory transistor occurs, it does not influence the read operation. This is because when the threshold voltage of the memory transistor largely decreases and the read current starts to increase, the MOS transistor cuts off and functions as a limiter. Therefore, in such a memory cell, there is the advantage that the upper limit of the read current can be controlled by controlling the threshold voltage of the MOS transistor and there is no unnecessary current consumption.

Erasure is performed by injecting electrons from the entire channel region by the modified FN (MFN) tunneling or direct tunneling.

When erasing an entire block at one time by the MFN tunneling, as shown in FIG. 26A, 11 to 12V is applied to all word lines WL1, WL2 . . . , and 0V is applied to all sub bit lines SBL1, SBL2, . . . , all sub source lines SSL1, SSL2, and the substrate (p-well W).

In this way, as shown in FIG. 26B, electrons are injected to carrier traps formed as the charge storing means from the substrate side, the threshold voltage rises, and erasure is performed. The time for this erasure by injecting electrons can be reduced to about 0.4 ms or improved by more than two orders of magnitude compared with the typical erasure time of 100 ms of the conventional hole injection erasure method using the direct tunnel effect. Further, in the conventional erasure method by hole injection, the time for passage of charges through the bottom insulating film is longer when compared with a write operation, so the insulating film may deteriorate. In the present invention, since hot hole injection is employed in write operation that has a short charge passing time, and erasure is performed by injecting electrons, the reliability is high.

The reliability of the memory cell was studied using the write, read, and erasure operations described above. Concerning the data rewrite, data retention, and read disturbance, it was found that more than $1 \times 10^5$ times of data rewrites, 10 years of data retention, and 10 years of resistance to read disturbance could be guaranteed. The data retention was more than 10 years at 85° C. even after $1 \times 10^5$ write-erasure cycles.

Seventh Embodiment

The seventh embodiment relates to a virtual grounding NOR type nonvolatile memory suitable for writing two bits in one cell.

Figure 27:
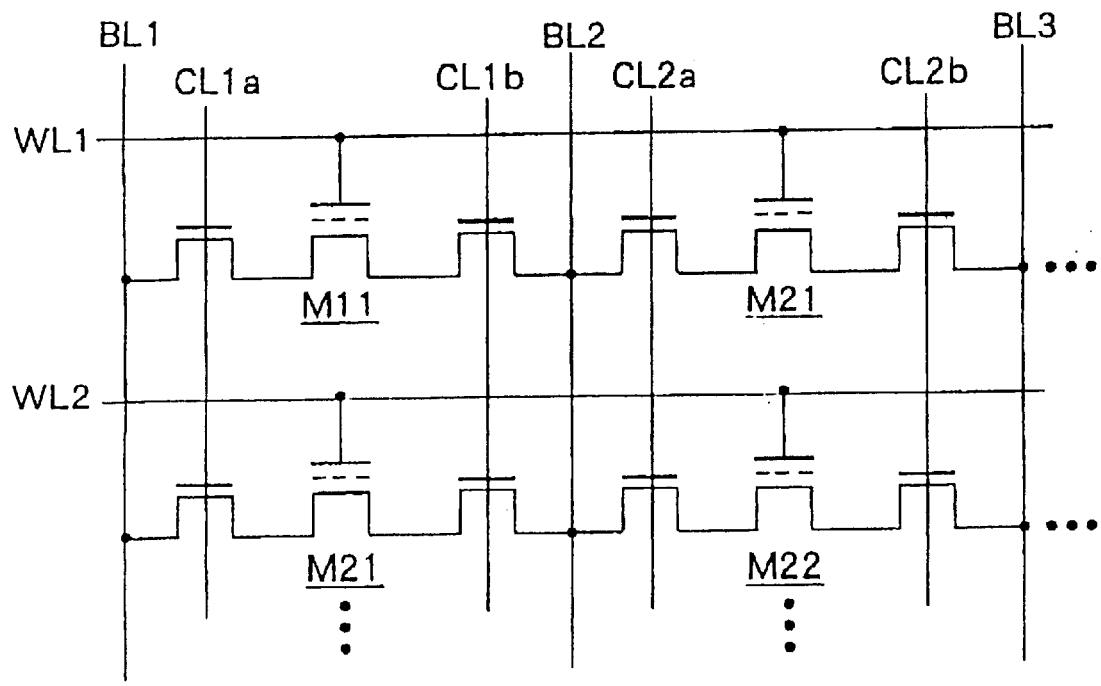
FIG. 27 is an equivalent circuit diagram of the configuration of a virtual grounding NOR type memory cell array according to a seventh embodiment of the present invention.

FIG. 27 is a circuit diagram of an example of the configuration of a memory cell array according to the seventh embodiment.

This memory transistor array is basically a virtual grounding NOR type memory cell array the same as that in the fourth embodiment. In the present memory cell array, however, in each memory transistor, the control gates are provided to extend from the source and drain impurity region side to partly overlap with the channel forming region.

Further, the array is provided with a control line CL1a commonly connecting one of the control gates of the memory transistors M11, M12, connected in the bit line direction, a control line CL1b commonly connecting the other of the control gates, a control line CL2a commonly connecting one of the control gates of the memory transistors M21, M22 . . . connected in the bit line direction and belonging to another row, a control line CL2b commonly connecting the other control gates. The control lines and the word lines are controlled separately.

In FIG. 27, by partly overlapping the control lines with the channel forming region, two MOS select transistors are formed at the two sides of the center memory transistor.

Figure 28:
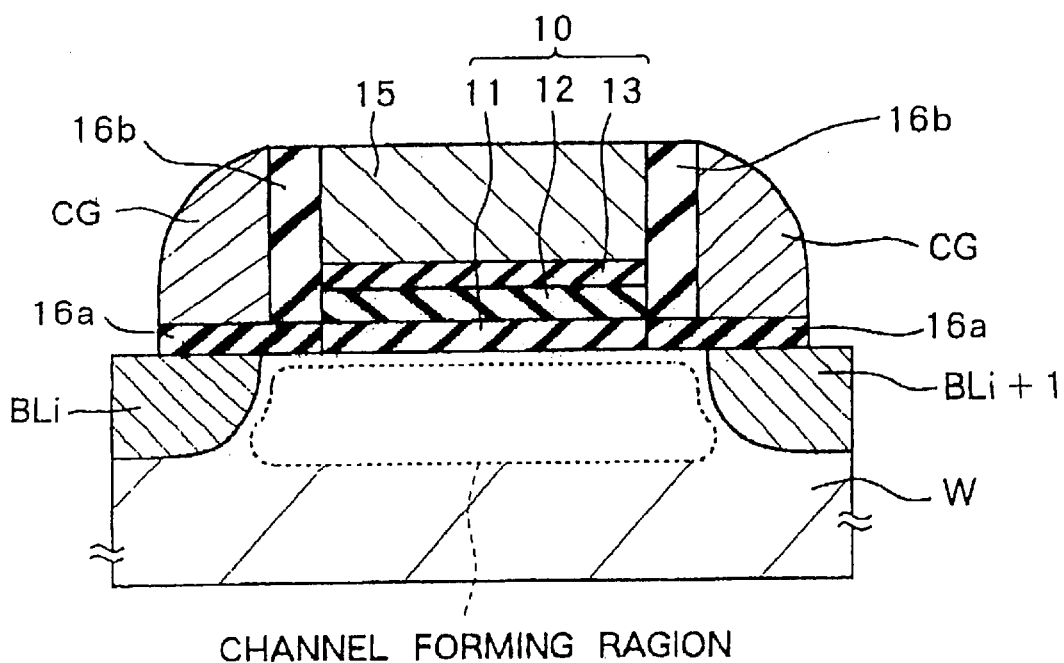
FIG. 28 is a cross-sectional view illustrating the configuration of a virtual grounding NOR type memory cell array according to the seventh embodiment of the present invention.

FIG. 28 illustrates the transistor configuration according to the seventh embodiment.

In this memory transistor, in the center portion of the upper surface of the channel forming region, a gate electrode 15 of the memory transistor is stacked on the gate insulating film 10 consisting of a bottom insulating film 11, a nitride film 12, and a top insulating film 13 in order from the bottom. This gate electrode 15 is connected with the upper interconnection layer forming the not shown word line WL and is connected in common between the cells in the word line direction.

On the other hand, the gate insulating films 16a of the select transistor are formed on the sub-bit lines SBL1 and SBLi+1 at the two sides of the memory transistor in the channel direction. On the gate insulating films 16a, control gates CG are formed. The control gates CG and the gate electrode 15 are separated by a spacer insulating film 16b between them.

In formation of such a memory transistor, for example, a gate insulating film 10 and the conductive film for forming gate electrode 15 are formed on the entire area, then, when patterning the gate electrode, the gate insulating film 10 is processed in order from the top layer. Next, this pattern is covered by the gate insulating film 16a. When making the spacer insulating film 16b thicker than the gate insulating film 16a, the same kind of insulating film is further stacked, then anisotropically etched. Due to this, the spacer insulating films 16b are formed on the sidewalls of the gate electrode. A conductive film for forming the control gate CG is deposited, then the conductive film is anisotropically etched to leave it as sidewalls and thereby form the control gate CG.

The write operation of a transistor formed in this way is a page write in the same way as in the sixth embodiment. The bias conditions are basically the same with those in the sixth embodiment.

However, in the seventh embodiment, because the bit lines are connected in common between two adjacent memory cells in the word line direction, the voltages on the control gates CG of the selected cell control according to whether a write operation is performed on the first region R1 or the second region R2 of the memory transistor. That is, a Voltage of 5 or 6V is applied to all the bit lines BL1, BL2, . . . , and a specified negative voltage of, for example, –8V applied on selected word lines (gate electrodes 15) is applied on the control gate CG only at the sides where the write operation is to be performed. As a result, under the control gate CG on which a negative voltage is applied, the n-type impurity region is deeply depleted, and the energy band bends sharply. Because of the band-to-band tunnel effect, electrons in the valence band tunnel to the conduction band, and a current flows into the n-type impurity region, and holes are generated. Those holes drift more or less to the center of the channel forming region and then are accelerated by the fairly strong electric field near the gate electrode 15, then part of them become hot electrons. The moments (magnitude and direction) of the high energy charges (hot holes) produced in the n-type impurity region are maintained and their kinetic energies are not lost much at all, therefore the holes are injected into the carrier traps formed as the charge storing means at a high speed and with a high efficiency.

As a result, the threshold voltage of the memory transistor is reduced from Vthe=2.0V to 2.5V in the erasure state to Vthp.ltoreq.0.5V in the write state.

On the other hand, 0V or at most 5 to 6V is applied to the control gates CG at the side that is not to be written. In the n-type impurity region under these control gates CG, the energy band does not bend sharply, therefore no hot holes are produced, and a write is effectively inhibited.

In such a write process, the same effects as in the sixth embodiment can be achieved, that is, the charge injection is fast and with a high efficiency, and the current consumption is small.

The read operation is basically a page read. The basic bias values are the same as those in the sixth embodiment, that is, 1.5V on the drain, 0V on the source, and 4.0V on the gate.

However, in the present embodiment, the common lines in the bit direction (bit lines BL1, BL2, . . . ) are shared between two memory cells adjacent in the word direction. Consequently, in the same way as the sixth embodiment, if 1.5V and 0V are alternately applied to the common lines in the bit line direction, two cells worth of data are read from the memory cells to the common lines (bit lines) connected with the memory cells and applied with 1.5V, and it is impossible to distinguish the data. Thereupon, it is necessary to turn on the control gate CG to cut off the channel beforehand. In other words, with one read operation cycle, only one row can be read. So, to read the first region R1 and the second region R2, two read operation cycles are needed, and four operation cycles are needed to read one page.

Erasure is performed, in the same way as in the first and sixth embodiments, by injecting electrons from the entire channel by the modified FN (MFN) tunneling or the direct tunneling.

Eighth Embodiment

The eighth embodiment relates to another example of the separated source line NOR type nonvolatile memory suitable for writing two bits in one cell.

Figure 29:
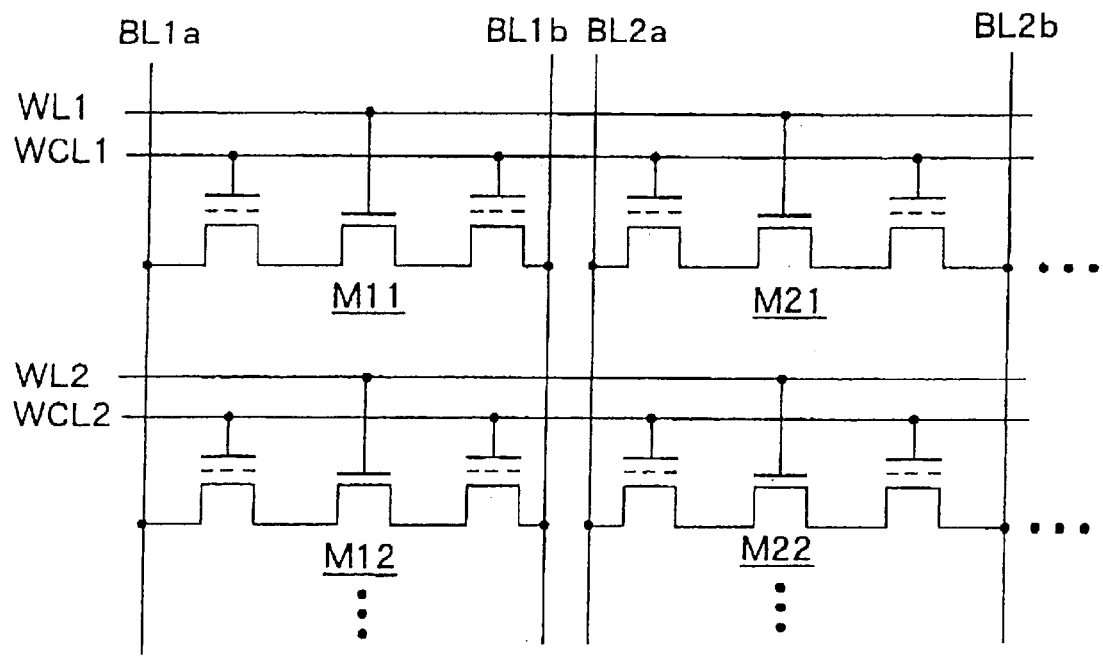
FIG. 29 is an equivalent circuit diagram of the configuration of a virtual grounding NOR type memory cell array according to an eighth embodiment of the present invention.

FIG. 29 is a circuit diagram of the configuration of a memory cell array according to the ninth embodiment.

In this memory cell array, in each memory cell, there is a MOS type select transistor at the center and is connected to the word lines WL1, WL2, . . , and memory transistors whose gates are connected to the word control line WCL1 or WCL2, . . . are formed at the two sides of the control transistor.

Figure 30:
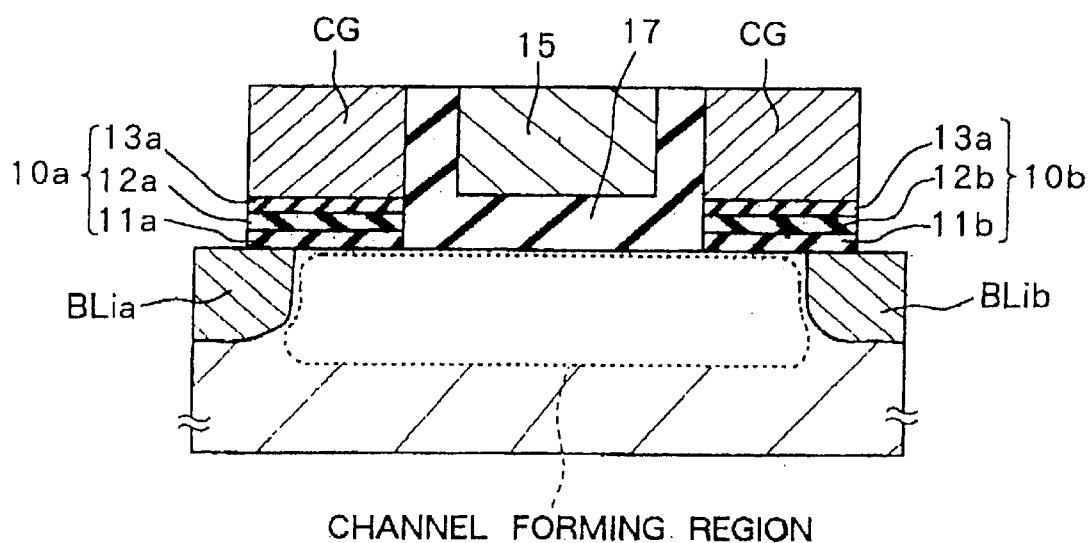
FIG. 30 is a cross-sectional view illustrating the configuration of a virtual grounding NOR type memory cell array according to the eighth embodiment of the present invention.

FIG. 30 illustrates an example of the memory cell array configuration according to the eighth embodiment.

Compared with the memory cell configuration shown in the sixth embodiment (FIG. 23), in the present memory cell configuration, each of the first region R1, the second region R2, and the third region R3 has its own gate electrodes. That is, the present memory cell has a gate electrode 15 formed in the center portion of the channel forming region and connected with the word line WL, and control gates CG which are isolated from the gate electrode 15 and provided at the two sides in the channel direction and connected to the word control line WCL.

The gate electrode 15 is buried in the space surrounded by the gate insulating film 17 between the two spatially separated control gates CG and the stacked pattern of the gate insulating films 10a and 10b at the source side and the drain side.

As an example showing one of the various methods of forming such a memory cell, for example, the gate insulating films 10a and 10b and the conductive films for forming the control gates CG are formed on the entire area, then, when patterning the two control gates CG, the gate insulating films 10a and 10b are processed simultaneously. Due to this, two control gates CG and the gate insulating film 10a, 10b are formed spatially separated at the side of the sub-bit line SBLi and the side of the sub-bit line SBLi+1, respectively. Then, the insulating film 17 and the conductive film forming the gate electrodes 15 are deposited and etched back. Due to this, the gate insulating film 17 and the gate electrodes 15 are formed buried between the two control gates CG and the stacked patterns of the gate insulating films 10a, 10b.

In a memory transistor formed in this way, in the same way as the sixth embodiment, in order to suppress the influence of over-write, a MOS transistor connected to the word line is formed in the center portion of the channel forming region. The threshold voltage of the control transistor is set to be, for example, in the range of 0.5V to 0.6V. Further, above the impurity regions serving as the bit lines BL1i and BLI+1, control gates CG are provided on ONO type gate insulating films 10a and 10b that include the charge storing means. Due to this, a memory transistor is formed.

The write operation of the transistor formed in the above way is also a page write in the same way as in the sixth embodiment. The bias conditions are basically the same with the sixth embodiment.

In the present embodiment, in the same way as the sixth embodiment, the bit lines are separated between the two memory cells adjacent in the word line direction and whether a write operation is performed or not to the first region R1 and second region R2 is controlled by if the bit line is given a voltage of 5 to 6V or is set open. First, a voltage of −5 to −6V is applied to the selected control gates CG (word control line WCL), then, at the side that is to be written, a voltage of about 5V is applied to the opened bit line.

Consequently, under the control gates CG to which a negative voltage is applied, the n-type impurity region applied with 5V is deeply depleted, and the energy band bends sharply. Because of the band-to-band tunnel effect, electrons in the valence band tunnel to the conduction band, and a current flows into the n-type impurity region, and holes are generated. Those holes drift more or less to the center of the channel forming region and are accelerated by the fairly strong electric field near the gate electrode 15, and part of them become hot electrons. The moments (magnitude and direction) of the high energy charges (hot holes) produced in the n-type impurity region are maintained and their kinetic energies are not lost much at all, therefore the holes are injected into the carrier traps formed as the charge storing means at a high speed and with a high efficiency.

As a result, the threshold voltage of the memory transistor is reduced from Vthe=2.0V to 2.5V in the erasure state to Vthp.ltoreq.0.5V in the write state.

On the other hand, because the control gate CG at the side that is not to be written is set open, in the n-type impurity region under this control gates CG, the energy band does not bend sharply, therefore no hot holes are produced, and a write is effectively inhibited.

Further, because a positive voltage is applied on the select gate 15, the depletion region extending from the n-type impurity region (sub-bit lines SBLi and SBLi+1) is suppressed, and the center part of the channel is not depleted. Therefore, in the eighth embodiment, the punch through endurance is strong compared with the sixth embodiment.

With such a write process, the same effect as in the sixth embodiment can be achieved, that is, a page write can be performed with a fast and highly efficient charge injection and small current consumption. Further, the charge injection area is localized, therefore, an over-write is prevented.

In the same way as the sixth embodiment, a read operation is basically a page read, and the basic bias values such as 1.5V on the drain, 0V on the source, and 4V on the gate are used.

Also, in the same way as the sixth embodiment, in this read process, by providing a MOS transistor, there is an advantage that the upper limit of the read current can be controlled by controlling the threshold voltage of the transistor and there is little wasted current consumption.

Erasure is performed in the same way with the first and the sixth embodiments, by injecting electrons from the entire channel by the modified FN (MFN) tunneling or the direct tunneling.

Below, the ninth and tenth embodiments show modifications of the structure of the memory transistors of the first to the eighth embodiments.

Ninth Embodiment

The ninth embodiment relates to a nonvolatile semiconductor memory device using as the charge storing means of a memory transistor a large number of mutually isolated silicon nanocrystals buried in the gate insulating film and having a size of for example below 10 nm (hereinafter referred to as the Si nanocrystal type).

Figure 31:
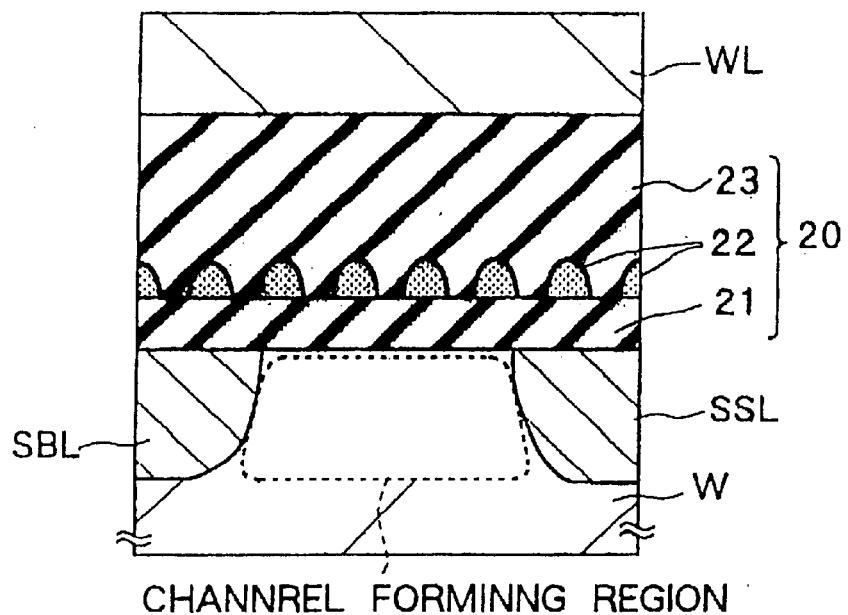
FIG. 31 is a cross-sectional view of a Si nanocrystal type memory transistor according to a ninth embodiment of the present invention in the word direction.

FIG. 31 is a cross-sectional view for illustrating the element structure of a silicon nanocrystal type memory transistor.

In the silicon nanocrystal type nonvolatile memory according to the present embodiment, the gate insulating film 20 is comprised of a bottom insulating film 21, silicon nanocrystals 22 thereon used as the charge storing means, and an oxide film 23 covering the silicon nanocrystals 22.

The rest of the configuration, that is, the semiconductor substrate, channel forming region, well W, source lines MSL, SSL, bit lines BL, MSL, SBL, and word lines WL, are the same as those in the first to the eighth embodiments.

The silicon nanocrystals 22 have a size (diameter) of preferably below 10 nm, for example, about 4.0 nm. The individual Si nanocrystals are separated spatially by the oxide film 23, for example, are at intervals of for example 4 nm or so.

The bottom insulating film 21 in this example is somewhat thicker than in the first embodiment due to the closeness of the charge storing means (Si nanocrystals 22) to the substrate side. The thickness may be suitably selected in the range from 2.6 nm to 5.0 nm in accordance with the application. Here, it is made a thickness of about 4.0 nm.

The memory transistor of this configuration is fabricated by forming the bottom insulating film 21, then forming a number of Si nanocrystals 22 on the bottom insulating film 21 by for example LP-CVD. Further, the oxide film 23 is formed to for example 7 nm by LP-CVD to bury the Si nanocrystals 22. In this LP-CVD, the feedstock gas is a mixture of DCS and $N_{2O}$ and the substrate temperature is made for example 700° C. At this time, the Si nanocrystals 22 are buried in the oxide film 23 and the surface of the oxide film 23 is flattened. When insufficiently flattened, a new flattening process (for example, CMP) may be performed. Next, the conductive film forming the word lines is formed and the gate stacked film is patterned all together, whereby the Si nanocrystal type memory transistor is completed.

The Si nanocrystals 22 formed in this way function as carrier traps discrete in the planar direction. The trap level can be deduced from the band discontinuity with the surrounding silicon oxide. It is deduced to be about 3.1 eV. Individual Si nanocrystals 22 of this size are able to hold several injected electrons. Note that a silicon nanocrystal can also be made smaller to hold a single electron.

Tenth Embodiment

The tenth embodiment relates to a nonvolatile semiconductor device using as the charge storing means of the memory transistor a large number of mutually separated fine split floating gates buried in the insulating film (hereinafter referred to as fine split FG type).

Figure 32:
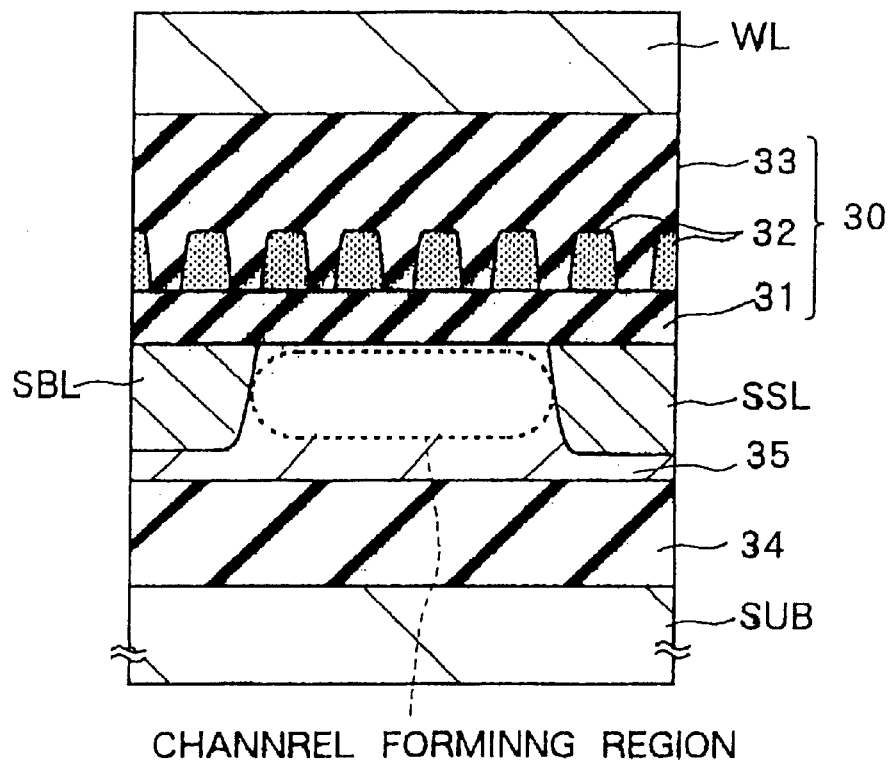
FIG. 32 is a cross-sectional view of a fine split FG type memory transistor according to a tenth embodiment of the present invention in the word direction.

FIG. 32 is a cross-sectional view of the element structure of a fine split FG type memory transistor.

In the fine split FG type nonvolatile memory of the tenth embodiment, the memory transistor is formed on an SOI substrate. The gate insulating film 30 is comprised of a bottom insulating film 31, fine split floating gates 32 thereon used as the charge storing means, and an oxide film 33 burying the fine split floating gates 32.

The fine split floating gates 32, along with the Si nanocrystals 22 in the ninth embodiment, are specific examples of "small particle conductors" spoken of in the present invention.

As the SOI substrate, use may be made of a separation-by-implanted—oxygen (SIMOX) substrate comprised of a silicon substrate implanted with oxygen ions at a high concentration to form a buried oxide film at a location deeper than the substrate surface or a bonded substrate consisting of any a substrate and a silicon substrate with an oxide film formed on its surface, etc. The SOI substrate formed by this method shown in FIG. 32 is comprised of a semiconductor substrate SUB, an isolation oxide film 34, and a silicon layer 35. In the silicon layer 35, sub-source lines SSL (source impurity regions S) and sub-bit lines (drain impurity regions D) are formed. The region between these two impurity regions is the channel forming region.

Instead of the semiconductor substrate SUB, use may also be made of a glass substrate, a plastic substrate, a sapphire substrate, etc.

The fine split floating gates 32 are obtained by processing a normal floating gate into fine poly-Si dots of for example a height of about 5.0 nm and a diameter of up to 8 nm.

The bottom insulating film 31 in the present embodiment is formed much thinner than the normal FG type. The thickness may be suitably selected in the range from 2.5 nm to 4.0 nm in accordance with the application. Here, it is made the thinnest 2.5 nm.

In the fabrication of a memory transistor of this configuration, a bottom insulating film 31 is formed on the SOI substrate, then a polysilicon film (final thickness 5 nm) is formed on the bottom insulating film 31 by for example LP-CVD. In this LP-CVD, the feedstock gas is a mixture of DCS and ammonia and the substrate temperature is made for example 650° C. Next, for example, electron beam lithography is used to process the polysilicon film into fine polysilicon dots of a diameter of for example up to 8 nm. The polysilicon dots function as the fine split type floating gates 32 (the charge storing means). Then, an oxide film 33 is formed to a thickness of for example up to 9 nm by LPCVD to bury the fine split type floating gates 32. In this LP-CVD, the feedstock gas is a mixture of DCS and $N_2O$, the substrate temperature is made for example 700° C. At this stage, the fine split type floating gates 32 are buried in the oxide film 33 and the surface of the oxide film 33 is flattened. If the flattening is insufficient, another flattening process (for example, CMP) may be performed. Next, the conductive film forming the word lines WL is formed and the gate stacked films are patterned, thereby completing the fine split FG type memory transistor.

Concerning the effects of using an SOI substrate and splitting a floating gate into fine dots, elements were fabricated in the manner described above and evaluated for performance. It was verified that good performances as predicted were obtained.

Modifications

While the invention has been described with reference to specific embodiments chosen for the purpose of illustration, it should be apparent that numerous modifications could be made thereto by those skilled in the art without departing from the basic concept and scope of the invention.

Specifically, various modifications may be made to the first to the tenth embodiments described above.

The present invention is also applicable to other kinds of NOR type cells, such as the DINOR type, which are not illustrated.

The "planarly dispersed charge storing means" in the present invention includes carrier traps in the bulk of a nitride film and carrier traps formed near the interface between an oxide film and the nitride film, hence the present invention is applicable even to an MNOS type whose gate insulating film is an NO (nitride-oxide) film.

In addition to a stand alone type nonvolatile memory, the present invention is also applicable to an embedded nonvolatile memory provided with logic circuits integrated on the same substrate.

Summarizing the effects of the present invention, according to the nonvolatile semiconductor memory device and the method for operating the same, in a write operation, by utilizing the hot holes caused by the band-to-band tunnel current, a charge can be quickly and highly efficiently injected into the planarly dispersed charge storing means. Because a channel is not formed during the write operation, the disadvantage as in the case of the conventional CHE injection of punch through preventing the gate length from being shortened is eliminated. In fact, in the present write process, the shorter the gate length, the greater the change of the threshold voltage which is able to be obtained and the higher the speed of the write operation.

On the other hand, when storing two bits in one cell, since the charge injection area is localized, over-write can be prevented, and charge diffusion at high temperature can also be prevented, therefore, the reliability is high. Further, since a channel is not formed during a write operation, in various NOR type memory cell arrays such as the so-called AND type and virtual grounding type, a page write can be performed with a low current and within one operation cycle.

Due to the present invention, a nonvolatile semiconductor memory device is realized which has a gate length of 100 nm and a large capacity, is fast and superior in scaling.

What is claimed is:

1. A nonvolatile semiconductor memory device comprising:
   a substrate;
   a channel forming region comprised of a first conductivity type semiconductor and formed in the substrate;
   a first and a second impurity regions comprised of a second conductivity type semiconductor and formed in the substrate and sandwiching the channel forming region between them, acting as a source and a drain in operation;
   a gate insulating film provided on the channel forming region;
   a gate electrode provided on the gate insulating film; and
   a charge storing means which is formed in the gate insulating film and dispersed in the plane facing the channel forming region and in a direction generally perpendicular to the gate electrode and is injected with hot holes at the time of operation from the first or the second impurity regions;
   wherein said first conductivity type is a p-type, and said second conductivity type is an n-type; and
   said gate insulating film comprises a first region into which hot holes are injected from said first impurity region, a second region into which hot holes are injected from said second impurity region, and a third region between the first and second regions and not injected by hot holes.

2. A nonvolatile semiconductor memory device as set forth in claim 1, wherein said hot holes are caused by a band-to-band tunnel current.

3. A nonvolatile semiconductor memory device as set forth in claim 1, wherein
the charge storing means is formed in the first and second regions; and
a region of distribution of the charge storing means is spatially separated by the third region.

4. A nonvolatile semiconductor memory device as set forth in claim 3, wherein
the first and second regions are stacked film structures comprised of a number of films stacked together, and
the third region is a single layer of a dielectric.

5. A nonvolatile semiconductor memory device as set forth in claim 3, wherein
the gate electrodes formed on the first and second regions and the gate electrode formed on the third region are spatially separated from each other.

6. A nonvolatile semiconductor memory device as set forth in claim 5, wherein in said channel forming region, two channel forming regions of two memory transistors and a channel forming region of a select transistor in between are in connection with each other.

7. A nonvolatile semiconductor memory device as set forth in claim 1, further comprising a first control gate at the outer side of the first region and a second control gate at the outer side of the second region which are spatially separated from said gate electrodes on said first, second and third regions.

8. A nonvolatile semiconductor memory device as set forth in claim 1, wherein a memory transistor comprising said channel forming region, said first and second impurity regions, said gate insulating film and said gate electrodes has a gate length no more than the gate length when the regions retaining hot holes from the first and second impurity regions are merged or partially merged in the gate insulating film when hot holes are injected from both the first and second impurity regions.

9. A nonvolatile semiconductor memory device as set forth in claim 1, wherein
said charge storing means does not have conductivity as a plane as a whole facing said channel forming region at least when there is not movement of charges with the outside.

10. A nonvolatile semiconductor memory device as set forth in claim 9, wherein said gate insulating film comprises
a bottom insulating film on said channel forming regions, and
a nitride film or an oxynitride film on said bottom insulating film.

11. A nonvolatile semiconductor memory device as set forth in claim 10, wherein said gate insulating film comprises
a bottom insulating film on said channel forming region, and
mutually insulated small particle conductors formed on the bottom film and functioning as said charge storing means.

12. A nonvolatile semiconductor memory device as set forth in claim 11, wherein said small particle conductors are of diameters not greater than 10 nanometers.

13. A nonvolatile semiconductor memory device comprising:
a substrate;
a channel forming region comprised of a first conductivity type semiconductor and formed in the substrate;
a first and a second impurity regions comprised of a second conductivity type semiconductor and formed in the substrate and sandwiching the channel forming region between them, acting as a source and a drain in operation;
a gate insulating film provided on the channel forming region;
a gate electrode provided on the gate insulating film; and
a charge storing means which is formed in the gate insulating film and dispersed in the plane facing the channel forming region and in a direction generally perpendicular to the gate electrode and is injected with hot holes at the time of operation from the first or the second impurity regions;
wherein said gate insulating film comprises a first region into which hot holes are injected from said first impurity region, a second region into which hot holes are injected from said second impurity region, and a third region between the first and second regions and not injected by hot holes; and
a plurality of memory transistors each including said channel forming region, said first and second impurity regions, said gate insulating film and said gate electrodes are arranged in both a word direction and a bit direction;
said nonvolatile semiconductor memory device further comprising:
a plurality of word lines for connecting the gate electrodes in the word direction; and
word drive circuits connected to the plurality of word lines for applying a negative voltage to selected word lines to which memory transistors to be operated are connected, and a positive voltage to nonselected word lines to which memory transistors to be operated are not connected.

14. A nonvolatile semiconductor memory device as set forth in claim 13, wherein in each of said plurality of memory transistors, a threshold voltage in a write state is lower than that in an erasure state.

15. A nonvolatile semiconductor memory device comprising:
a substrate;
a channel forming region comprised of a first conductivity type semiconductor and formed in the substrate;
a first and a second impurity regions comprised of a second conductivity type semiconductor and formed in the substrate and sandwiching the channel forming region between them, acting as a source and a drain in operation;
a gate insulating film provided on the channel forming region;
a gate electrode provided on the gate insulating film; and
a charge storing means which is formed in the gate insulating film and dispersed in the plane facing the channel forming region and in a direction generally perpendicular to the gate electrode and is injected with hot holes at the time of operation from the first or the second impurity regions;
wherein said gate insulating film comprises a first region into which hot holes are injected from said first impurity region, a second region into which hot holes are injected from said second impurity region, and a third region between the first and second regions and not injected by hot holes; and a plurality of memory transistors each including said channel forming region, said first and second impurity regions, said gate insulating film, and said gate electrodes, are arranged in both a word direction and a bit direction;

said nonvolatile semiconductor memory device further comprises:

a plurality of word lines; and a plurality of common lines which intersect with said plurality of word lines in an electrically insulated state;

the plurality of said gate electrodes are respectively connected to said plurality of word lines; and the plurality of said first and second impurity regions are respectively coupled with the plurality of common lines.

16. A nonvolatile semiconductor memory device as set forth in claim 15, comprising:

word lines commonly connecting said gate electrodes in a word direction;

first common lines commonly connecting said first impurity regions in a bit direction; and second common lines commonly connecting said second impurity regions.

17. A nonvolatile semiconductor memory device as set forth in claim 16, wherein said first common lines include first sub-lines commonly connecting said first impurity regions in a bit direction and first main lines commonly connecting the first sub-lines in a bit direction;

said second common lines include second sub-lines commonly connecting said second impurity regions and second main lines commonly connecting the second sub-lines; and said plurality of memory transistors are connected in parallel between said first sub-lines and the second sub-lines.

18. A nonvolatile semiconductor memory device comprising:

a substrate;

a channel forming region comprised of a first conductivity type semiconductor and formed in the substrate;

a first and a second impurity regions comprised of a second conductivity type semiconductor and formed in the substrate and sandwiching the channel forming region between them, acting as a source and a drain in operation;

a gate insulating film provided on the channel forming region;

a gate electrode provided on the gate insulating film;

a charge storing means which is formed in the gate insulating film and dispersed in the plane facing the channel forming region and in a direction generally perpendicular to the gate electrode and is injected with hot holes at the time of operation from the first or the second impurity regions; and means for causing said hot holes by a band-to-band tunnel current;

wherein said first conductivity type is a p-type, and said second conductivity type is an n-type.

19. A nonvolatile semiconductor memory device as set forth in claim 18, wherein said gate insulating film comprises:

a first region into which hot holes are injected from said first impurity region;

a second region into which hot holes are injected from said second impurity region; and a third region between the first and second regions and not injected by hot holes.

20. A nonvolatile semiconductor memory device as set forth in claim 19, wherein the charge storing means is formed in the first and second regions; and a region of distribution of the charge storing means is spatially separated by the third region.

21. A nonvolatile semiconductor memory device as set forth in claim 20, wherein the first and second regions are stacked film structures comprised of a number of films stacked together, and the third region is a single layer of a dielectric.

22. A nonvolatile semiconductor memory device as set forth in claim 20, wherein the gate electrodes formed on the first and second regions and the gate electrode formed on the third region are spatially separated from each other.

23. A nonvolatile semiconductor memory device as set forth in claim 22, wherein in said channel forming region, two channel forming regions of two memory transistors and a channel forming region of a select transistor in between are in connection with each other.

24. A nonvolatile semiconductor memory device as set forth in claim 18, further comprising a first control gate at the outer side of the first region and a second control gate at the outer side of the second region which are spatially separated from said gate electrodes on said first, second and third regions.

25. A nonvolatile semiconductor memory device as set forth in claim 18, wherein a memory transistor comprising said channel forming region, said first and second impurity regions, said gate insulating film and said gate electrodes has a gate length no more than the gate length when the regions retaining hot holes from the first and second impurity regions are merged or partially merged in the gate insulating film when hot holes are injected from both the first and second impurity regions.

26. A nonvolatile semiconductor memory device as set forth in claim 18, wherein said charge storing means does not have conductivity as a plane as a whole facing said channel forming region at least when there is not movement of charges with the outside.

27. A nonvolatile semiconductor memory device as set forth in claim 26, wherein said gate insulating film comprises a bottom insulating film on said channel forming region, and a nitride film or an oxynitride film on said bottom insulating film.

28. A nonvolatile semiconductor memory device as set forth in claim 27, wherein said gate insulating film comprises a bottom insulating film on said channel forming region, and mutually insulated small particle conductors formed on the bottom film and functioning as said charge storing means.

29. A nonvolatile semiconductor memory device as set forth in claim 28, wherein said small particle conductors are of diameters not greater than 10 nanometers.

30. A nonvolatile semiconductor memory device comprising:
   a substrate;
   a channel forming region comprised of a first conductivity type semiconductor and formed in the substrate;
   a first and a second impurity regions comprised of a second conductivity type semiconductor and formed in the substrate and sandwiching the channel forming region between them, acting as a source and a drain in operation;
   a gate insulating film provided on the channel forming region;
   a gate electrode provided on the gate insulating film;
   a charge storing means which is formed in the gate insulating film and dispersed in the plane facing the channel forming region and in a direction generally perpendicular to the gate electrode and is injected with hot holes at the time of operation from the first or the second impurity regions; and
   means for causing said hot holes by a band-to-band tunnel current;
   wherein a plurality of memory transistors each including said channel forming region, said first and second impurity regions, said gate insulating film and said gate electrodes are arranged in both a word direction and a bit direction;
   said nonvolatile semiconductor memory device further comprising:
      a plurality of word lines for connecting the gate electrodes in the word direction; and
      word drive circuits connected to the plurality of word lines for applying a negative voltage to selected word lines to which memory transistors to be operated are connected, and a positive voltage to nonselected word lines to which memory transistors to be operated are not connected.

31. A nonvolatile semiconductor memory device as set forth in claim 30, wherein in each of said plurality of memory transistors, a threshold voltage in a write state is lower than that in an erasure state.

32. A nonvolatile semiconductor memory device comprising:
   a substrate;
   a channel forming region comprised of a first conductivity type semiconductor and formed in the substrate;
   a first and a second impurity regions comprised of a second conductivity type semiconductor and formed in the substrate and sandwiching the channel forming region between them, acting as a source and a drain in operation;
   a gate insulating film provided on the channel forming region;
   a gate electrode provided on the gate insulating film;
   a charge storing means which is formed in the gate insulating film and dispersed in the plane facing the channel forming region and in a direction generally perpendicular to the gate electrode and is injected with hot holes at the time of operation from the first or the second impurity regions; and
   means for causing said hot holes by a band-to-band tunnel current;
   wherein a plurality of memory transistors each including said channel forming region, said first and second impurity regions, said gate insulating film, and said gate electrodes, are arranged in both a word direction and a bit direction;
   said nonvolatile semiconductor memory device further comprises:
      a plurality of word lines; and
      a plurality of common lines which intersect with said plurality of word lines in an electrically insulated state;
      the plurality of said gate electrodes are respectively connected to said plurality of word lines; and
      the plurality of said first and second impurity regions are respectively coupled with the plurality of common lines.

33. A nonvolatile semiconductor memory device as set forth in claim 32, comprising:
   word lines commonly connecting said gate electrodes in a word direction;
   first common lines commonly connecting said first impurity regions in a bit direction; and
   second common lines commonly connecting said second impurity regions.

34. A nonvolatile semiconductor memory device as set forth in claim 33, wherein
   said first common lines include
   first sub-lines commonly connecting said first impurity regions in a bit direction and
   first main lines commonly connecting the first sub-lines in a bit direction;
   said second common lines include
   second sub-lines commonly connecting said second impurity regions and
   second main lines commonly connecting the second sub-lines; and
   said plurality of memory transistors are connected in parallel between said first sub-lines and the second sub-lines.

* * * * *